United States Patent
Lin et al.

(10) Patent No.: US 9,542,884 B2
(45) Date of Patent: Jan. 10, 2017

(54) DISPLAY PANEL

(71) Applicant: AU OPTRONICS CORP., Hsin-Chu (TW)

(72) Inventors: Ya-Ting Lin, Hsin-Chu (TW); Ting-Wei Guo, Hsin-Chu (TW)

(73) Assignee: AU OPTRONICS CORP., Hsin-Chu (TW)

( * ) Notice: Subject to any disclaimer, the term of this patent is extended or adjusted under 35 U.S.C. 154(b) by 94 days.

(21) Appl. No.: 14/461,710

(22) Filed: Aug. 18, 2014

(65) Prior Publication Data

US 2015/0371584 A1 Dec. 24, 2015

(30) Foreign Application Priority Data

Jun. 23, 2014 (TW) .............................. 103121631 A

(51) Int. Cl.
  *G09G 3/3225* (2016.01)
  *G09G 3/32* (2016.01)
  *G11C 19/28* (2006.01)

(52) U.S. Cl.
  CPC .......... *G09G 3/3225* (2013.01); *G09G 3/3266* (2013.01); *G11C 19/28* (2013.01);
  (Continued)

(58) Field of Classification Search
  CPC ..................... G09G 3/2092; G09G 2310/0289; G09G 2300/0819; G09G 2320/045; G09G 2310/0286; G09G 3/3266; G09G 2320/0233; G09G 3/3225; G11C 19/28
  (Continued)

(56) References Cited

U.S. PATENT DOCUMENTS 8,392,775 B2   3/2013 Liu
2007/0262929 A1   11/2007 Kim et al.
(Continued)

FOREIGN PATENT DOCUMENTS

CN   101097310 A   1/2008
CN   101383125 A   3/2009
(Continued)

OTHER PUBLICATIONS

Taiwan Patent Office, "Office Action," Aug. 21, 2015.
State Intellectual Property Office of the People's Republic of China, "Office Action", issued on May 17, 2016.

*Primary Examiner* — Andrew Sasinowski
*Assistant Examiner* — Chineyere Wills-Burns
(74) *Attorney, Agent, or Firm* — WPAT, PC; Justin King

(57) ABSTRACT

A display panel includes a display area first and second gate line driving circuits. The display area includes a plurality of pixels is configured to determine how to process a data transmitted on a data line according to first and second control signals transmitted on first and second gate lines respectively and a second control signal transmitted on a second gate line and determine when to emit light according to a light emitting control signal transmitted on a light emitting control line. The first gate line driving circuit is coupled to the first gate line and for providing the first control signal thereto. The second gate line driving circuit is coupled to the second gate line and the light emitting control line and configured to provide the second control signal and the light emitting control signal thereto, respectively.

19 Claims, 15 Drawing Sheets

(52) U.S. Cl.
CPC ............... *G09G 2300/0819* (2013.01); *G09G 2310/0286* (2013.01); *G09G 2310/0289* (2013.01); *G09G 2320/0233* (2013.01); *G09G 2320/045* (2013.01)

(58) Field of Classification Search
USPC ........................................................ 345/100
See application file for complete search history.

(56) References Cited

U.S. PATENT DOCUMENTS

| | | | | |
|---|---|---|---|---|
| 2008/0001889 A1* | 1/2008 | Chun | ................... | G09G 3/2011 345/96 |
| 2008/0246697 A1 | 10/2008 | Kim | | |
| 2009/0046041 A1* | 2/2009 | Tanikame | ............ | G09G 3/3233 345/76 |
| 2009/0303169 A1* | 12/2009 | Tanikame | ............ | G09G 3/3266 345/100 |
| 2011/0041020 A1* | 2/2011 | Liu | ................... | G01R 31/31853 714/731 |
| 2011/0316833 A1* | 12/2011 | Chang | ................... | G09G 3/3677 345/211 |
| 2012/0281156 A1 | 11/2012 | Tanikame | | |
| 2013/0215098 A1 | 8/2013 | Tanikame et al. | | |
| 2014/0218273 A1 | 8/2014 | Tanikame | | |
| 2014/0285108 A1* | 9/2014 | Kim | ..................... | G11C 19/184 315/291 |
| 2014/0361306 A1 | 12/2014 | Tanikame | | |
| 2015/0138051 A1 | 5/2015 | Tanikame et al. | | |
| 2015/0357390 A1 | 12/2015 | Tanikame | | |

FOREIGN PATENT DOCUMENTS

| | | |
|---|---|---|
| CN | 101599257 A | 12/2009 |
| CN | 102760406 | 10/2012 |
| TW | 200915271 | 4/2009 |
| TW | 201003605 | 1/2010 |

* cited by examiner

DISPLAY PANEL

TECHNICAL FIELD

The present disclosure relates to a display panel, and more particularly to a driving circuit of a display panel.

BACKGROUND

Flat panel display is a display apparatus for displaying images based on pixel circuits; and for displaying images normally, various types of pixel circuits may need to be adopted with various types of driving circuit designs.

Referring to FIG. 1, which is a circuit view of a conventional pixel circuit used in a flat panel display. As shown, the pixel circuit 10 is configured to, while being supplied with operations voltage levels OVDD, VIN and OVSS, determine when to receive display data DATA and determine when to control a light emitting diode D1 to emit light by controlling P-type transistors T1, T2, T3, T4, T5 and T6 and two capacitors Cst1 and Cst2 through gate control signals Scan_N, Scan_N−1 and a light emitting control signal EM. For example, as shown in FIG. 1, the transistor T1 is configured to have its control terminal only electrically coupled to the gate control signal Scan_N−1; it first terminal only connected to the first terminal of the capacitors $C_{st1}$, the second terminal of the capacitors $C_{st2}$, the first terminal of the transistor T3 and the control terminal of the transistor T4; and its second terminal only electrically coupled to the operation voltage level VIN. The transistor T2 is configured to have its control terminal only connected to the light emitting control signal EM and the control terminal of the transistor T5; it first terminal only connected to the second terminal of the capacitors $C_{st1}$ and the operation voltage level OVDD; and its second terminal only connected to the first terminal of the transistor T4 and the first terminal of the transistor T6. The transistor T3 is configured to have its control terminal only connected to the first terminal of the capacitors $C_{st2}$, the control terminal of the transistor T6 and the gate control signal Scan_N; and it second terminal only connected to the second terminal of the transistor T4 and the first terminal of the transistor T5. The transistor T5 is configured to have its second terminal only connected to the first terminal of the light emitting diode D1. The light emitting diode D1 is configured to have its second terminal only connected to the operation voltage level OVSS. The transistor T6 is configured to have its second terminal only connected to the display data DATA. In response to the pixel circuit 10 of FIG. 1, currently a driving circuit of FIG. 2 is employed.

Referring to FIG. 2, which is a circuit block view of a conventional driving circuit used in a flat panel display. As shown, the flat panel display 20 includes a display area 200, in which a plurality of pixel circuits as illustrated in FIG. 1 are disposed. Each pixel circuit is controlled by the gate control signals Scan_N, Scan_N−1 and the light emitting control signal EM. In order to clarify the relationship between the control signals and the pixel circuits, the gate control signals supplied to the pixel circuit in the first row are provided by the first gate control signal generation unit Scan_P(1) and the second gate control signal generation unit Scan_P−1(1), respectively; and the light emitting control signal supplied to the pixel circuit in the first row is provided by the light emitting control signal generation unit EMP(1). Therefore, when the display area 200 has 960 rows of pixel circuit, accordingly there must exist 960 first gate control signal generation units Scan_P(1), Scan_P(2), . . . , Scan_P(959) and Scan_P(960), 960 second gate control signal generation units Scan_P−1(1), Scan_P−1(2), . . . , Scan_P−1(959) and Scan_P−1(960), and 960 light emitting control signal generating units EMP(1), EMP(2), . . . , EMP(959) and the EMP(960).

In a conventional driving circuit as shown in FIG. 2, the first gate control signal generation units Scan_P(1)~Scan_P(960) and the second gate control signal generation units Scan_P−1(1)~Scan_P−1(960) are disposed on the same side of the display area 200, and the light emitting control signal generating units EMP(1)~EMP(960) are disposed on another side of the display area 200. Each one of the first gate control signal generation units Scan_P(1)~Scan_P(960) and each one of the second gate control signal generation units Scan_P−1(1)~Scan_P−1(960) are controlled by one of the shift registers RSR(1)~RSR(960). For example, a pair of the first gate control signal generation unit Scan_P(1) and the second gate control signal generation unit Scan_P−1(1) are only controlled by the shift registers RSR(1); . . . ; and a pair of the first gate control signal generation unit Scan_P(960) and the second gate control signal generation unit Scan_P−1(960) are only controlled by the shift registers RSR(960). Similarly, each one of the light emitting control signal generation units EMP(1)~EMP(960) is controlled by one of the shift registers LSR(1)~LSR(960). For example, the light emitting control signal generation unit EMP(1) is only controlled by the shift register LSR(1); . . . ; and the light emitting control signal generation unit EMP(960) is only controlled by the shift register LSR(960). It is to be noted that the shift registers LSR(1)~LSR(960) and the shift registers RSR(1)~RSR(960) are different elements or different groups. In addition, to facilitate a less complicate design for clock signals, the driving circuit may further be disposed with dummy shift registers RBDSR, LUDSR and LBDSR. Specifically, the dummy shift register RBDSR is only connected to the last shift register RSR(960); the dummy shift register LUDSR is only connected to the first shift register LSR(1); and the dummy shift register LBDSR is only connected to the last shift register LSR(960).

Through the driving circuit of FIG. 2, the display panel 20 can display images normally. However, when the pixel circuits 10 of FIG. 1 are configured to display images through a driving of the driving circuit of FIG. 2, the gate control signals Scan_N, Scan_N−1 may have mismatch impedance issue, which may lead to a poor luminous uniformity on the display panel 20. In addition, conventionally, the shift registers, the first gate control signal generation unit and the second gate control signal generation unit may need a lot of transistors for an implementation; thus, once these transistors have electrical drifts caused by manufacturing process errors, these shift registers may not have normal functions and consequentially may result in display deterioration.

SUMMARY

The present disclosure discloses a display panel, which includes a display area a first gate line driving circuit and a second gate line driving circuit. The display area includes a plurality of pixels. Each one of the plurality of pixels is configured to determine how to process a data transmitted on a data line according to a first control signal transmitted on a first gate line and a second control signal transmitted on a second gate line and determine when to emit a light according to a light emitting control signal transmitted on a light emitting control line. The first gate line driving circuit is disposed in a first area outside the display area. The first gate line driving circuit is electrically coupled to the first gate line and configured to provide the first control signal to the first gate line. The second gate line driving circuit is disposed in a second area outside the display area. The second gate line driving circuit is electrically coupled to the second gate line and configured to provide the second control signal to the second gate line. The second gate line driving circuit is further electrically coupled to the light emitting control line and configured to provide the light emitting control signal to the light emitting control line. The first area and the second area are located on different sides of the display area.

BRIEF DESCRIPTION OF THE DRAWINGS

The present disclosure will become more readily apparent to those ordinarily skilled in the art after reviewing the following detailed description and accompanying drawings, in which.

DETAILED DESCRIPTION OF PREFERRED EMBODIMENTS

The present disclosure will now be described more specifically with reference to the following embodiments. It is to be noted that the following descriptions of preferred embodiments of this disclosure are presented herein for purpose of illustration and description only. It is not intended to be exhaustive or to be limited to the precise form disclosed.

Figure 1:
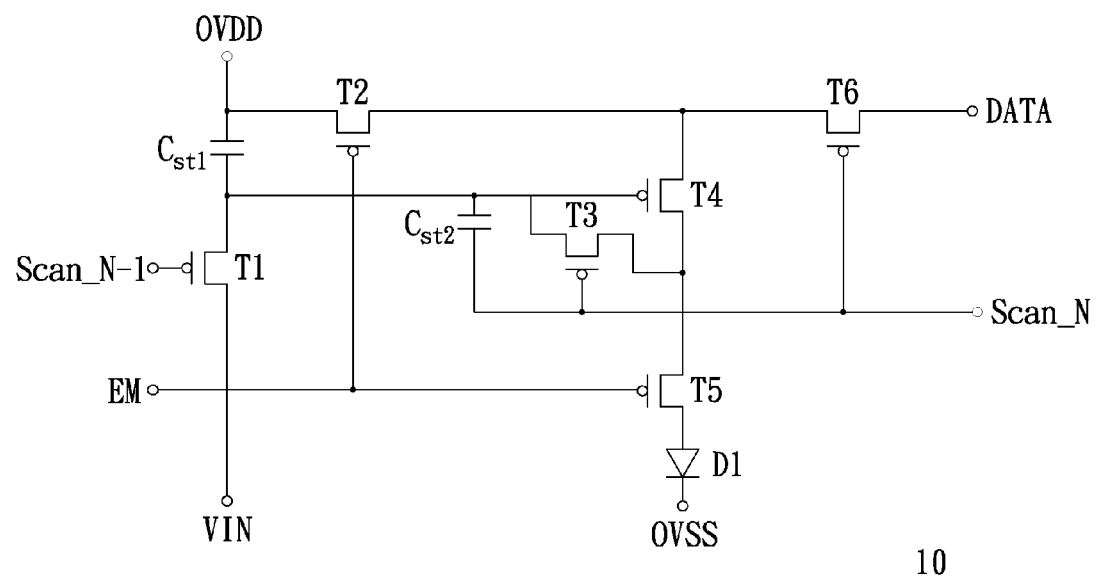
FIG. 1 is a is a circuit view of a conventional pixel circuit used in a flat panel display.
Figure 2:
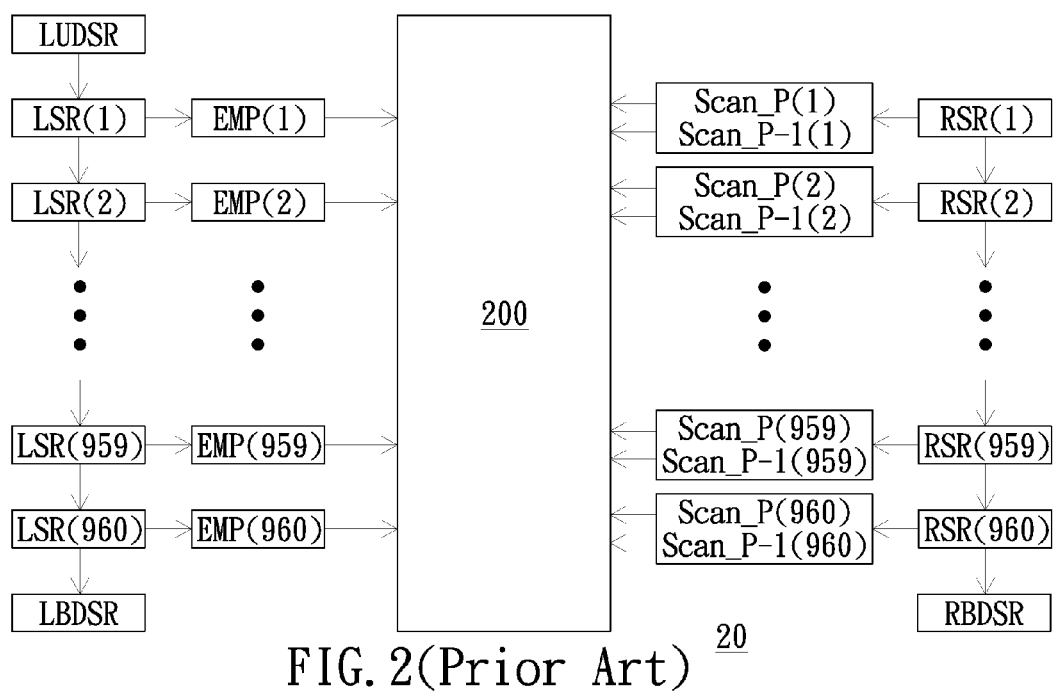
FIG. 2 is a circuit block view of a conventional driving circuit used in a flat panel display.
Figure 3:
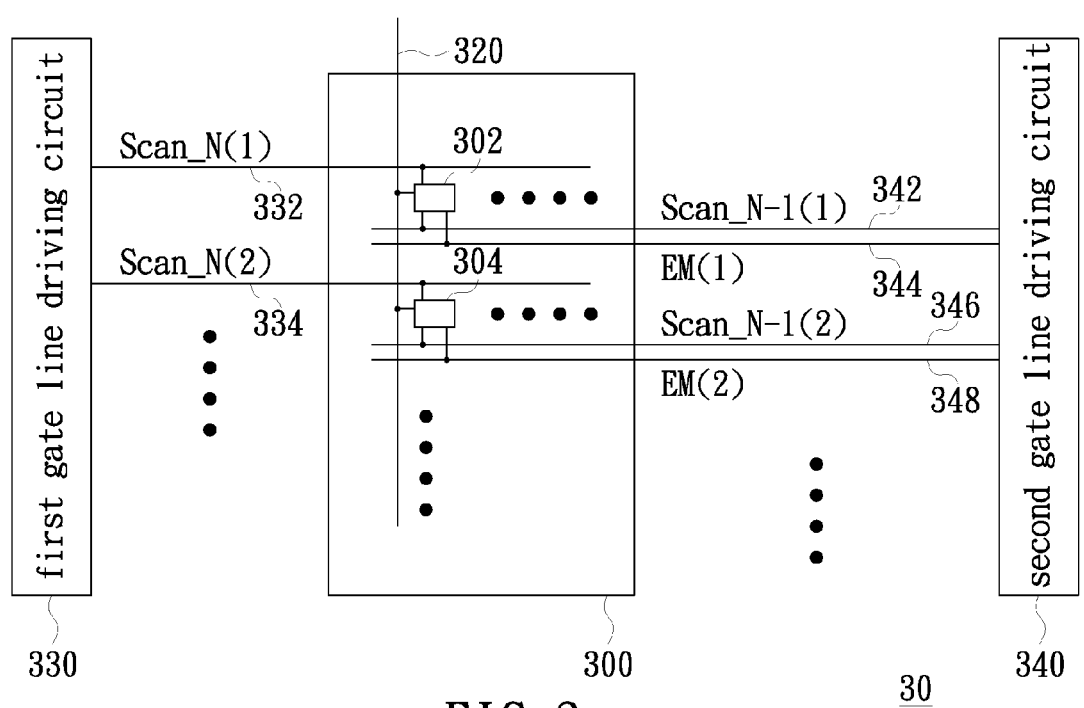
FIG. 3 is a circuit block view of a flat panel display in accordance with an embodiment of the present disclosure.

FIG. 3 is a circuit block view of a flat panel display in accordance with an embodiment of the present disclosure. As shown, the flat panel display 30 in the present embodiment includes a display area 300, a first gate line driving circuit 330, a second gate line driving circuit 340, a data line 320, first gate lines 332, 334, second gate lines 342, 346, and light emitting control lines 344, 348. In addition, the display area 300 includes a plurality of pixels 302, 304. Each pixel is affected by the respective first gate line, the respective second gate lines and the respective light emitting control line. For example, the pixel 302 is electrically coupled to the first gate line 332, the second gate line 342, the light emitting control line 344 and the data lines 320 and is configured to determine how to process the data transmitted on the data line 320 according to the control signal Scan_N(1) transmitted on the first gate line 332 (hereafter the control signal Scan_N is referred to as the first control signal) and the control signal Scan_N−1(1) transmitted on the second gate line 342 (hereafter the control signal Scan_N−1 is referred to as the second control signal) and determine when to emit light according to the light emitting control signal EM(1) transmitted on the light emitting control line 344. Similarly, the pixel 304 is electrically coupled to the first gate line 334, the second gate line 346, the light emitting control line 348 and the data lines 320 and is configured to determine how to process the data transmitted on the data line 320 according to the first control signal Scan_N(2) transmitted on the first gate line 334 and the second control signal Scan_N−1(2) transmitted on the second gate line 346 and determine when to emit light according to the light emitting control signal EM(2) transmitted on the light emitting control line 348. The pixels 302, 304 may have circuit structures same as the pixel circuit 10 of FIG. 1; however the present invention is not limited thereto.

As shown in FIG. 3, the first gate line driving circuit 330 is disposed on the left external side of the display area 300, and the second gate line driving circuit 340 is disposed on the right external side of the display area 300. The first gate line driving circuit 330 is electrically coupled to the first gate lines 332, 334 and is configured to provide the first control signals Scan_N(1), Scan_N(2) to the first gate lines 332, 334, respectively. Besides being electrically coupled to the second gate lines 342, 346, the second gate line driving circuit 340 is further electrically coupled to the light emitting control lines 344, 348 and is configured to provide the second control signals Scan_N−1(1), Scan_N−1(2) to the second gate lines 342, 346 and provide the light emitting control signals EM(1), EM(2) to the light emitting control lines 344, 348, respectively.

Through the above circuit design, the signals with relatively large driving impedance differences are separated to two groups. To facilitate a better understanding of the present disclosure, herein the gate control signals Scan_N, Scan_N−1 and the light emitting control signal EM are took as an example for driving the pixel circuit 10 shown in FIG. 1. Because the gate control signal Scan_N is responsible for reading data and compensating the threshold voltage, the impedance load (RC Loading) of the being-driven gate control signal Scan_N is much larger than that of the being-driven gate control signal Scan_N−1 and the being-driven light emitting control signal EM. Thus, in the present embodiment, the gate control signal Scan_N is designed to be generated by the first gate line driving circuit 330 independently; and the gate control signal Scan_N−1 and the light emitting control signal EM are designed to be generated by the second gate line driving circuit 340.

Figure 4:
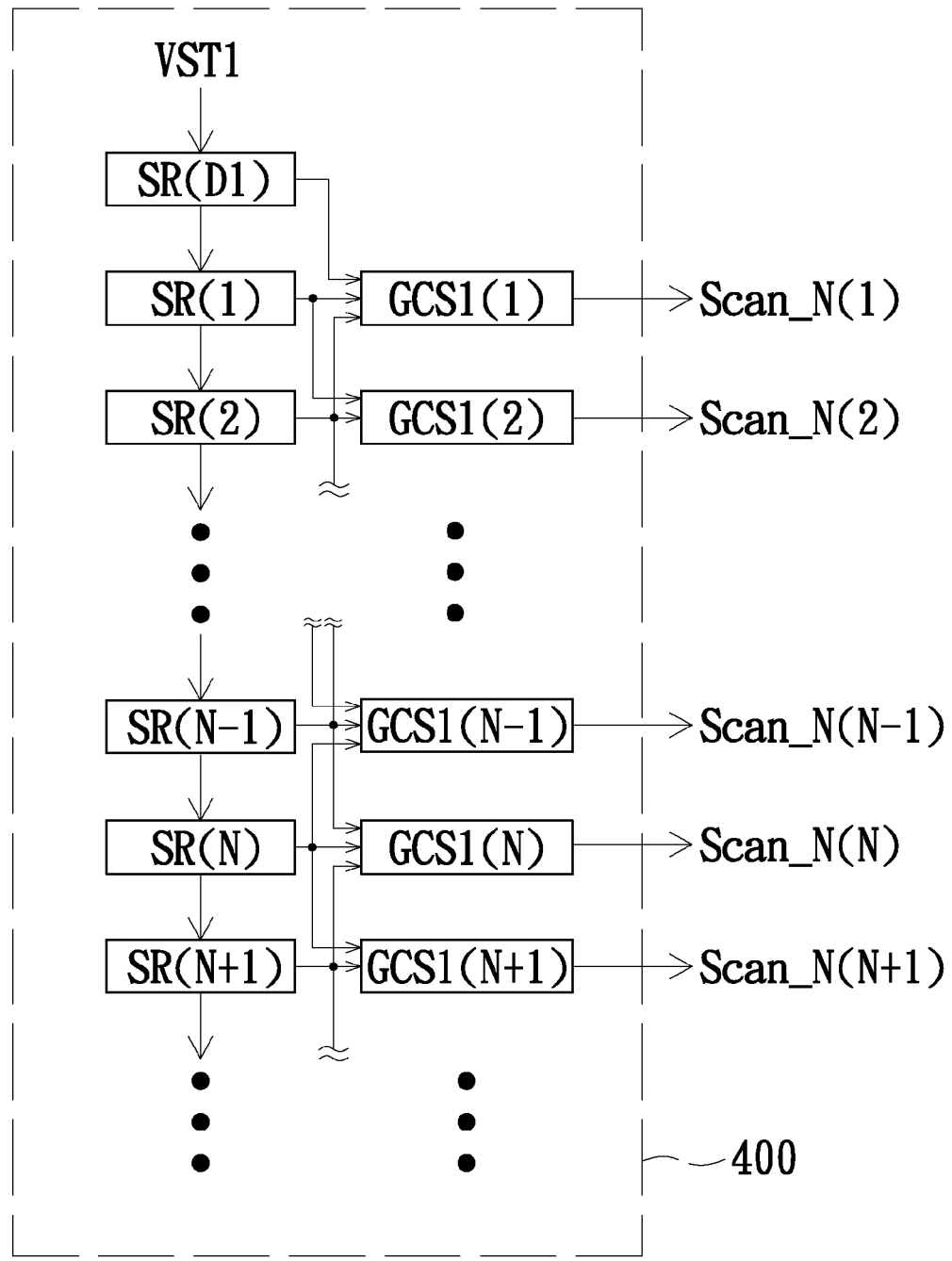
FIG. 4 is a circuit block view of a first gate line driving circuit in accordance with an embodiment of the present disclosure.

Referring to FIG. 4, which is a circuit block view of a first gate line driving circuit in accordance with an embodiment of the present disclosure. As shown, the first gate line driving circuit 400 in the present embodiment includes shift registers SR(D1), SR(1), SR(2), . . . , SR(N−1), SR(N), SR(N+1) and gate control signal generators (also called first gate control signal generators) GCS1(1), GCS1(2), . . . , GCS1(N−1), GCS1(N) and GCS1(N+1). Each one of the gate control signal generators GCS1(1), GCS1(2), . . . , GCS1(N−1), GCS1(N) and GCS1(N+1) is electrically coupled to some of the shift registers SR(D1), SR(1), SR(2), . . . , SR(N−1), SR(N) and SR(N+1) and is configured to generate the first control signals Scan_N(1), Scan_N(2), . . . , Scan_N(N−1), Scan_N(N) and Scan_N(N+1) respectively according to the outputs of the respective electrically-coupled shift registers. For example, the gate control signal generator GCS1(1) is connected to the shift registers SR(D1), SR(1) and SR(2) and accordingly generate the first control signal Scan_N(1); the gate control signal generator GCS1(N) is connected to the shift registers SR(N−1), SR(N) and SR(N+1) and accordingly generate the first control signal Scan_N(N); and so on. In other words, the shift register SR(1) is connected to the gate control signal generators GCS1(1), GCS1(2); the shift register SR(2) is connected to the gate control signal generators GCS1(1), GCS1(2) and GCS1(3); the shift register SR(N) is connected to the gate control signal generators GCS1(N−1), GCS1(N) and GCS1(N+1); and so on.

As shown in FIG. 4, the shift registers SR(D1), SR(1), SR(2), . . . , SR(N−1), SR(N) and SR(N+1) are sequentially electrically coupled in a cascade manner. Specifically, a start signal VST1 is provided to the shift register SR(D1) firstly; then, an output signal is generated by the shift register SR(D1) through an operation of the shift register SR(D1) and the output signal is then transmitted from the shift register SR(D1) to the next-stage shift register SR(1); and so on. This signal generation and transmission process is like that the start signal VST1 has a time delay performed by the shift register SR(D1) first and then transmitted to the shift register SR(1); wherein the aforementioned signal generation and transmission process is the foundation of an operation of the cascaded shift registers. Form another viewpoint, the meaning of the output signal of the shift register SR(D1) to the shift register SR(1) is equivalent to the meaning of the start signal VST1 to the shift register SR(D1). In other words, the output of the shift register SR(D1) is the start signal required for an operation of the shift register SR(1); the output of the shift register SR(1) is the start signal required for an operation of the shift register SR(2); the output of the shift register SR(N−1) is the start signal required for an operation of the shift register SR(N); and the output of the shift register SR(N) is the start signal required for an operation of the shift register SR(N+1).

In addition, it is to be noted that the shift register SR(D1) corresponds to no first gate control signal generator. In the present embodiment, the shift register SR(D1) is used to adjust the timings of signals and generate the start signal for the next-stage shift register; thus, the shift register SR(D1) is also referred to as a dummy shift register. The number of dummy shift register is not limited but generally is selected based on the sequence of input or output signals in time. Thus, the number of the dummy shift register in the present embodiment is not limited to one and can be adjusted in response to the actual needs.

Figure 5:
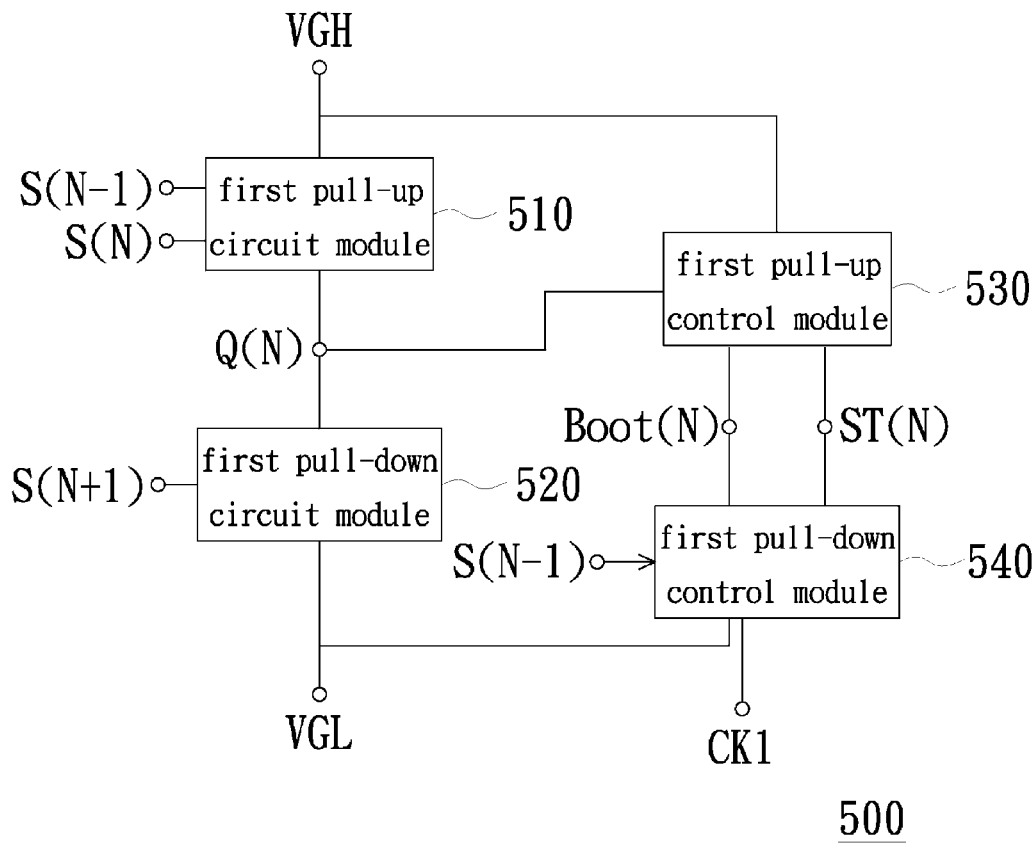
FIG. 5 is a circuit block view of a shift register in a first gate line driving circuit in accordance with an embodiment of the present disclosure.

Next, referring to FIG. 5, which is a circuit block view of a shift register in the first gate line driving circuit in accordance with an embodiment of the present disclosure. As shown, the Nth-stage shift register 500 in the present embodiment includes a first pull-up circuit module 510, a first pull-down circuit module 520, a first pull-up control module 530 and a first pull-down control module 540. Specifically, the first pull-up circuit module 510 is configured to receive a first operation voltage level VGH and the start signal S(N−1) provided from the previous-stage (the (N−1)th-stage) shift register to the Nth-stage shift register and determine whether to turn on an electrical channel between the first operation voltage level VGH and a first control node Q(N) or not according to the start signal S(N−1) and the start signal S(N) provided by the Nth-stage shift register. The first pull-down circuit module 520 is configured to receive a second operation voltage level VGL and the start signal S(N+1) provided from the next-stage (the (N+1)th-stage) shift register and determine whether to turn on an electrical channel between the second operation voltage level VGL and the first control node Q(N) or not according to the start signal S(N+1). The first pull-up control module 530 is electrically coupled to the first control node Q(N) and configured to receive the first operation voltage level VGH and determine whether to turn on an electrical channel between the first operation voltage level VGH and a second control node Boot(N) and an electrical channel between the first operation voltage level VGH and a start signal node ST(N) or not according to the voltage level at the first control node Q(N). The first pull-down control module 540 is configured to receive a clock signal CK1, the second operation voltage level VGL and the start signal S(N−1) provided from the (N−1)th-stage shift register and determine whether to transmit the second operation voltage level VGL to the second control node Boot(N) or not according to start signal S(N−1) and determine whether to turn on an electrical channel between the clock signal CK1 and the start signal node ST(N) or not according to the voltage level at the second control node Boot(N). In addition, it is to be noted that the start signal S(N) provided by the Nth-stage shift register is constituted by the voltage level at the start signal node ST(N); and the voltage level at the second control node Boot(N) is also referred to as an output signal provided to the shift register LSR(N).

The circuit structure of the shift register of the present disclosure will be described in detail in the following embodiments. It is to be noted that the transistors in each following embodiment are exemplarily implemented with P-type transistors. However, because being functioned as switches, these P-type transistors can be replaced by other types of switches such as N-type transistors, or P-type transistor and N-type transistor, and the present disclosure is not limited thereto.

Figure 6:
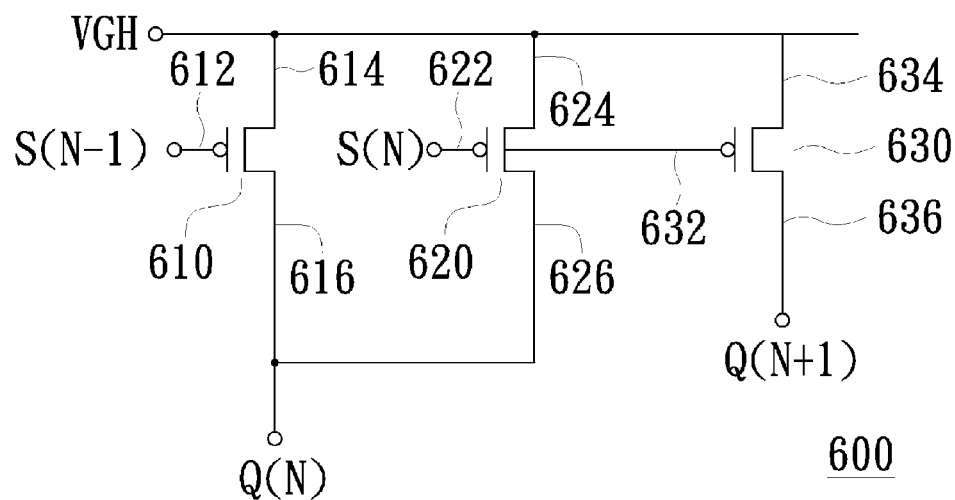
FIG. 6 is a detailed circuit view of a first pull-up circuit module in a shift register in accordance with an embodiment of the present disclosure.

FIG. 6 is a detailed circuit view of a first pull-up circuit module in a shift register in accordance with an embodiment of the present disclosure. As shown, the first pull-up circuit module 600 in the present embodiment includes P-type transistors 610, 620 and 630. The P-type transistor 610 is configured to have its control terminal 612 for receiving the start signal S(N−1) provided by the previous-stage (the (N−1)th-stage) shift register; its channel terminal 614 for receiving the first operation voltage level VGH; and its channel terminal 616 electrically coupled to the first control node Q(N). The P-type transistor 620 is configured to have its control terminal 622 for receiving the start signal S(N) provided by the present-stage (the Nth-stage) shift register; its channel terminal 624 for receiving the first operation voltage level VGH; and its channel terminal 626 electrically coupled to the first control node Q(N). The P-type transistor 630 is configured to have its control terminal 632 for receiving the start signal S(N) provided by the present-stage (the Nth-stage) shift register; its channel terminal 634 for receiving the first operation voltage level VGH; and its channel terminal 636 electrically coupled to the first control node Q(N+1) in the next-stage (the (N+1)th-stage) shift register.

Figure 7:
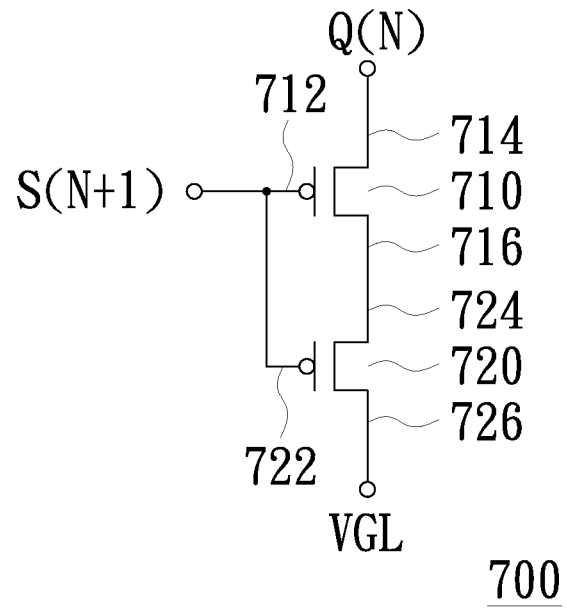
FIG. 7 is a detailed circuit view of a first pull-down circuit module in a shift register in accordance with an embodiment of the present disclosure.

Next, referring to FIG. 7, which is a detailed circuit view of a first pull-down circuit module in a shift register in accordance with an embodiment of the present disclosure. As shown, the first pull-down circuit module 700 in the present embodiment includes P-type transistors 710, 720. The P-type transistor 710 is configured to have its control terminal 712 for receiving the start signal S(N+1); its channel terminal 714 electrically coupled to the first control node Q(N). The P-type transistor 720 is configured to have its control terminal 722 for receiving the start signal S(N+1); its channel terminal 724 electrically coupled to the channel terminal 716 of the P-type transistor 710; and its channel terminal 726 for receiving the second operation voltage level VGL.

Figure 8:
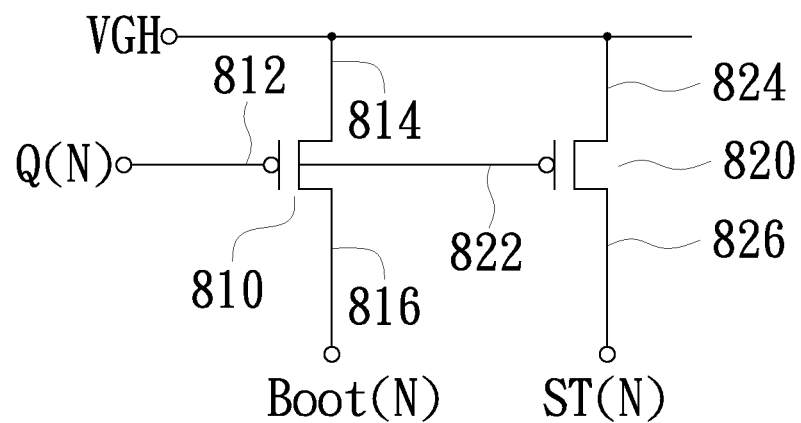
FIG. 8 is a detailed circuit view of a first pull-up control module in a shift register in accordance with an embodiment of the present disclosure.

Next, referring to FIG. 8, which is a detailed circuit view of a first pull-up control module in a shift register in accordance with an embodiment of the present disclosure. As shown, the first pull-up control module 800 in the present embodiment includes P-type transistors 810, 820. The P-type transistor 810 is configured to have its control terminal 812 electrically coupled to the first control node Q(N); its channel terminal 814 for receiving the first operation voltage level VGH; and its channel terminal 816 electrically coupled to the second control node Boot(N). The P-type transistor 820 is configured to have its control terminal 822 electrically coupled to the first control node Q(N); its channel terminal 824 for receiving the first operation voltage level VGH; and its channel terminal 826 electrically coupled to the start signal node ST(N).

Figure 9:
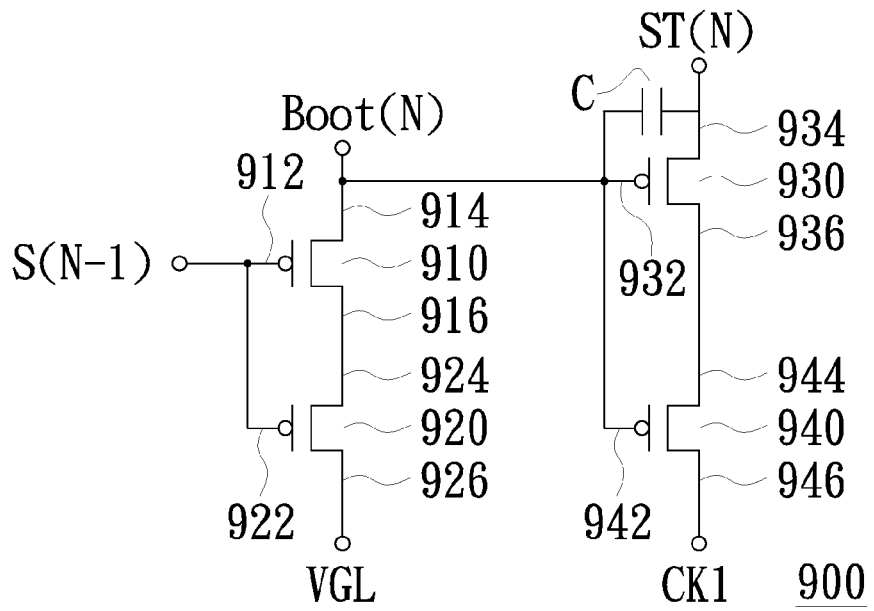
FIG. 9 is a detailed circuit view of a first pull-down control module in a shift register in accordance with an embodiment of the present disclosure.

Next, referring to FIG. 9, which is a detailed circuit view of a first pull-down control module in a shift register in accordance with an embodiment of the present disclosure. As shown, the first pull-down control module 900 in the present embodiment includes P-type transistors 910, 920, 930 and 940 and a capacitor C. The P-type transistor 910 is configured to have its control terminal 912 for receiving the start signal ST(N−1) provided by the previous-stage (the (N−1)th-stage) shift register and its channel terminal 914 electrically coupled to the second control node Boot(N). The P-type transistor 920 is configured to have its control terminal 922 for receiving the start signal S(N−1); its channel terminal 924 electrically coupled to the channel terminal 916 of the P-type transistor 910; and its channel terminal 926 for receiving the second operation voltage level VGL. The P-type transistor 930 is configured to have its control terminal 932 electrically coupled to the second control node Boot(N) and its channel terminal 934 electrically coupled to the start signal node ST(N). The P-type transistor 940 is configured to have its control terminal 942 electrically coupled to the second control node Boot(N); its channel terminal 944 electrically coupled to the channel terminal 936 of the P-type transistor 930; and its channel terminal 946 for receiving the clock signal CK1. The capacitor C is configured to have its first terminal electrically coupled to the second control node Boot(N) and its second terminal electrically coupled to the start signal node ST(N).

Figure 10:
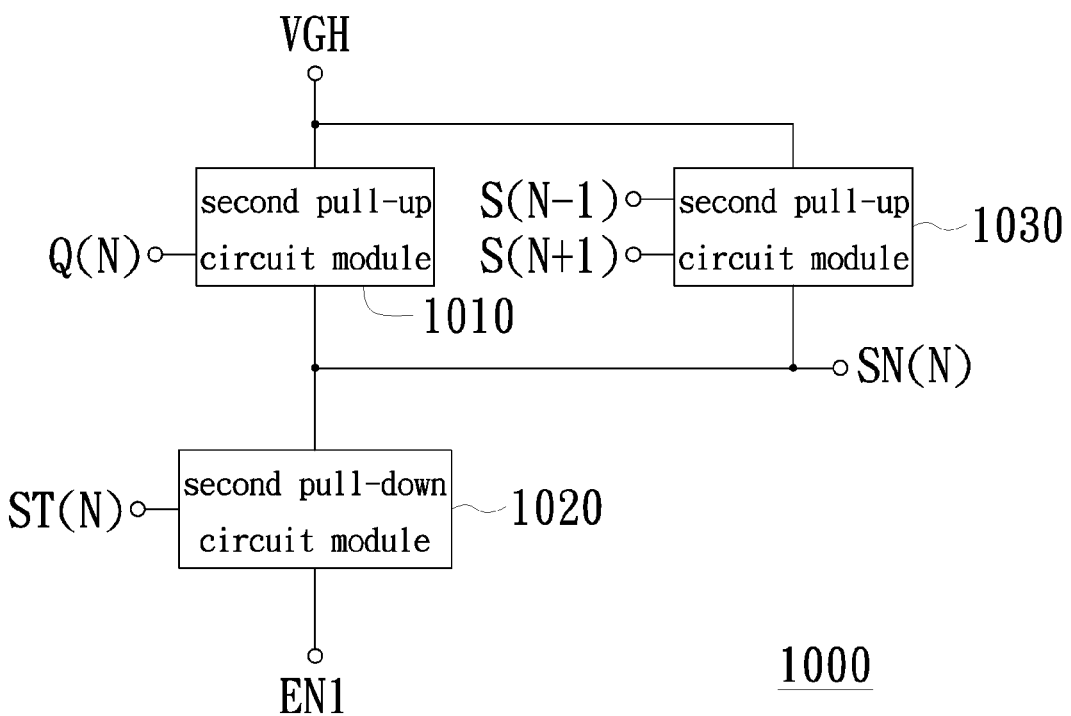
FIG. 10 is a circuit block view of a gate control signal generator in accordance with an embodiment of the present disclosure.

The internal circuit of the gate control signal generator will be described as follow with a reference of related figures. Referring to FIG. 10, which is a circuit block view of a gate control signal generator in accordance with an embodiment of the present disclosure. As shown, the gate control signal generator 1000 in the present embodiment includes a second pull-up control module 1010, a second pull-down control module 1020 and a second pull-up circuit module 1030. As shown, besides for receiving the first operation voltage level VGH, the second pull-up control module 1010 is further electrically coupled to the first control node Q(N) and the gate control signal output node SN(N) and thereby being configured to determine whether to turn on an electrical channel from the first operation voltage level VGH to the gate control signal output node SN(N) or not according to the voltage level at the first control node Q(N). Besides for receiving the enable signal EN1, the second pull-down control module 1020 is further electrically coupled to the start signal node ST(N) and the gate control signal output node SN(N) and thereby being configured to determine whether to turn on an electrical channel from the enable signal EN1 to the gate control signal output node SN(N) or not according to the voltage level at the gate control signal output node SN(N). Besides for receiving the start signal S(N−1) provided by the previous-stage (the (N−1)th-stage) shift register, the start signal S(N+1) provided by the next-stage (the (N+1)th-stage) shift register and the first operation voltage level VGH, the second pull-up circuit module 1030 is further electrically coupled to the gate control signal output node SN(N) and thereby being configured to determine whether to turn on an electrical channel from the first operation voltage level VGH to the gate control signal output node SN(N) or not according to the start signal S(N−1) and the start signal S(N+1). In addition, it is to be noted that the first control signal Scan_N provided by the Nth-stage shift register is constituted by the voltage level at the gate control signal output node SN(N).

Figure 11:
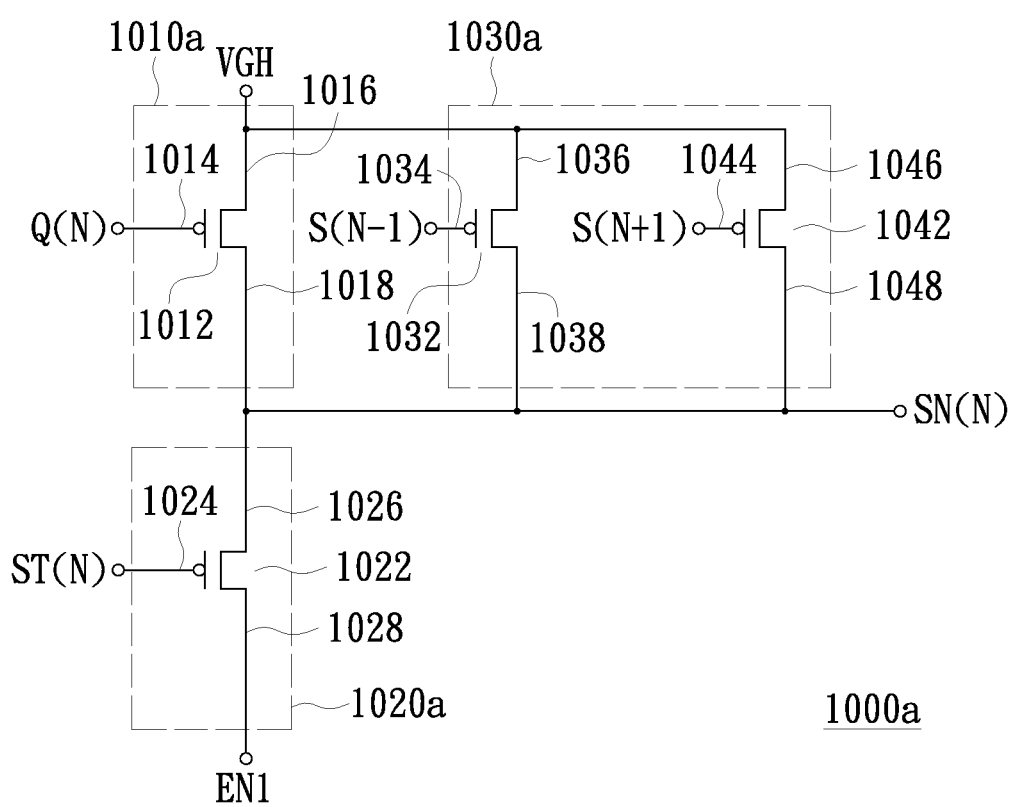
FIG. 11 is a detailed circuit view of a gate control signal generator in accordance with an embodiment of the present disclosure.

FIG. 11 is a detailed circuit view of a gate control signal generator in accordance with an embodiment of the present disclosure. As shown, the gate control signal generator 1000a in the present embodiment includes a second pull-up control module 1010a, a second pull-down control module 1020a and a second pull-up circuit module 1030a. The second pull-up control module 1010a includes a P-type transistor 1012. The P-type transistor 1012 is configured to have its control terminal 1014 electrically coupled to the first control node Q(N); its channel terminal 1016 for receiving the first operation voltage level VGH; and its channel terminal 1018 electrically coupled to the gate control signal output node SN(N). The second pull-down control module 1020a includes a P-type transistor 1022. The P-type transistor 1022 is configured to have its control terminal 1024 electrically coupled to the start signal node ST(N); its channel terminal 1026 electrically coupled to the gate control signal output node SN(N); and its channel terminal 1028 for receiving the enable signal EN1. The second pull-up circuit module 1030a includes P-type transistors 1032, 1042. The P-type transistor 1032 is configured to have its control terminal 1034 for receiving the start signal S(N−1) provided by the previous-stage (the (N−1)th-stage) shift register; its channel terminal 1036 for receiving the first operation voltage level VGH; and its channel terminal 1038 electrically coupled to the gate control signal output node SN(N). The P-type transistor 1042 is configured to have its control terminal 1044 for receiving the start signal S(N+1) provided by the next-stage (the (N+1)th-stage) shift register; its channel terminal 1046 for receiving the first operation voltage level VGH; and its channel terminal 1048 electrically coupled to the gate control signal output node SN(N).

Figure 12:
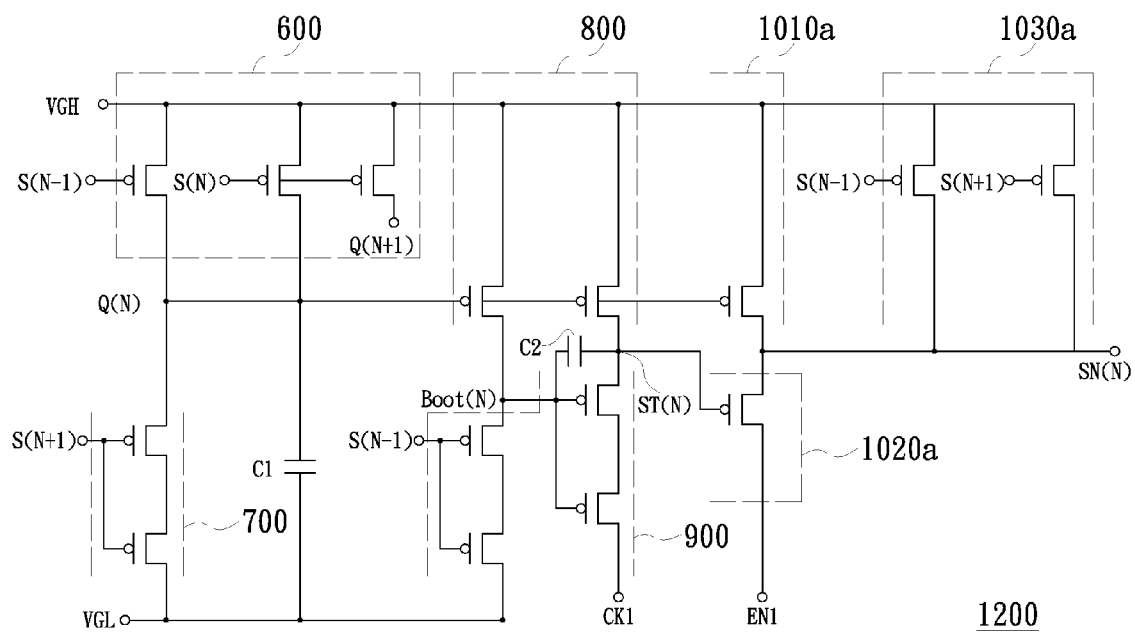
FIG. 12 is a detailed circuit view of a shift register and a gate control signal generator in accordance with an embodiment of the present disclosure.

Through a combination of the aforementioned embodiments, a detailed circuit view consisting of one stage of shift register and a related gate control signal generator is obtained as illustrated in FIG. 12. As shown, most of the circuit components and the connection ways among the components in the circuit 1200 of FIG. 12 have been described in FIGS. 5~11, and no redundant detail is to be given herein. Further, to stabilize the operation of the circuit 1200, the circuit 1200 further includes a capacitor C1. In addition, the capacitor C2 in the circuit 1200 is equivalent to the capacitor C in FIG. 9. The capacitor C1 is configured to have its first terminal electrically coupled to the first control node Q(N) and its second terminal for receiving the second operation voltage level VGL; The capacitor C2 is configured to have its first terminal electrically coupled to the second control node Boot(N) and its second terminal f electrically coupled to the start signal node ST(N) such as the second terminal of the capacitor C2 is connected to the start signal node ST(N) via the second pull-down control module 1020a. The detailed operation of the circuit 1200 will be described as follow with a reference of related timing charts.

Figure 13:
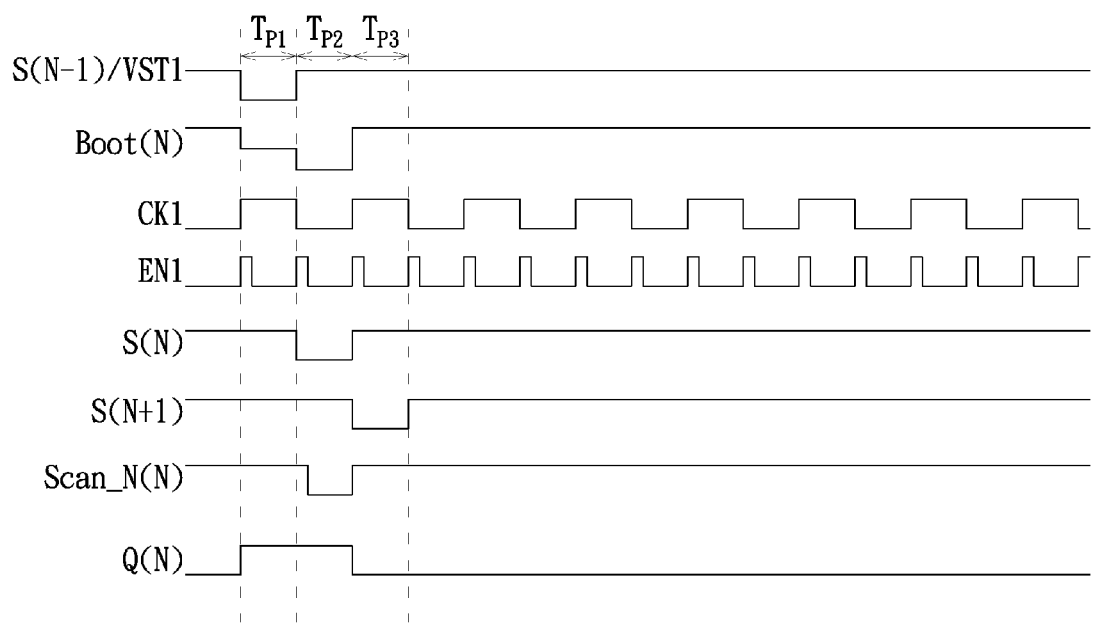
FIG. 13 is an operation timing chart of a first gate line driving circuit in accordance with an embodiment of the present disclosure.

FIG. 13 is an operation timing chart of a first gate line driving circuit in accordance with an embodiment of the present disclosure. To facilitate a better understanding of the present disclosure, Referring to FIG. 13 with FIGS. 5~12 together.

Firstly, as described above, it is understood that for the first-stage shift register, its input waveform is the initially-provided start signal VST1. For the Nth-stage shift register and its corresponding gate control signal generator, its input waveform is the output signal of the (N−1)th-stage shift register (that is, the start signal S(N−1) provided by the (N−1)th-stage shift register). The following description will be described mainly based on the Nth-stage shift register.

As shown in FIG. 13, the start signal S(N−1) is converted from a high-voltage level to a low-voltage level at the beginning of the operation period $T_{P1}$, and then is maintained at a low-voltage level during the operation period $T_{P1}$. Thus, during the operation period $T_{P1}$, the P-type transistor 610 in FIG. 6, the P-type transistors 910, 920 in FIG. 9 and the P-type transistor 1032 in FIG. 11 are turned on. Accordingly, the electrical channel between the first control node Q(N) and the first operation voltage level VGH is turned on by the P-type transistor 610; the electrical channel between the second control node Boot(N) and the second operation voltage level VGL is turned on by the P-type transistors 910, 920; and the electrical channel between the gate control signal output node SN(N) and the first operation voltage level VGH is turned on by the P-type transistor 1032. Therefore, during the operation period $T_{P1}$, the voltage levels at the first control node Q(N) and the gate control signal output node SN(N) are maintained at a high-voltage level; and the voltage level at the second control node Boot(N) is pulled down from a high-voltage level to a low-voltage level (about the second operation voltage level VGL).

Because being constituted by the voltage level at the gate control signal output node SN(N), the first control signal Scan_N(N) is maintained at a high-voltage level during the operation period $T_{P1}$.

Because the voltage level at the first control node Q(N) is maintained at a high-voltage level during the operation period $T_{P1}$, the P-type transistors 810, 820 in FIG. 8 and the P-type transistor 1012 in FIG. 11 are turned off. In contrast, because the voltage level at the second control node Boot(N) is pulled down to a low-voltage level during the operation period $T_{P1}$, the P-type transistors 930, 940 in FIG. 9 are turned on; and consequentially the electrical channel between the start signal node ST(N) and the clock signal CK1 is turned on by the P-type transistors 930, 940. Therefore, same as the clock signal CK1, the voltage level at the start signal node ST(N) is maintained at a high-voltage level during the operation period $T_{P1}$. Because the voltage level at the start signal node ST(N) is maintained at a high-voltage level, the start signal S(N) is also maintained at a high-voltage level. Thus, the P-type transistors 620, 630 in FIG. 6 and the transistor 1022 in FIG. 11 also are maintained in a turned-off state.

As shown in FIG. 13, when the operation period $T_{P1}$ is end, the start signal S(N−1) is converted from a low-voltage level to a high-voltage level at the beginning of the operation period $T_{P2}$ and then is maintained at the high-voltage level during the operation period $T_{P2}$. With the start signal S(N−1) being converted from a low-voltage level to a high-voltage level, the P-type transistor 610 in FIG. 6, the P-type transistors 910, 920 in FIG. 9 and the P-type transistor 1032 in FIG. 11 are converted from a turned-on state to a turned-off state. Therefore, the P-type transistors 610, 910, 920 and 1032 are maintained in a turned-off state during the operation period $T_{P2}$. Accordingly, the voltage level at the first control node Q(N) is maintained and has no change; and the voltage level at the second control node Boot(N) is further pulled down to a lower voltage level (lower than the second operation voltage level VGL) due to the couple effect between the P-type transistor 910 and the capacitor C2. By being pulled down, the voltage level at the second control node Boot(N) is lower than the low-voltage level of the clock signal CK1 during the operation period $T_{P2}$. Thus, the P-type transistors 930, 940 in FIG. 9 are maintained in a turn-on state; and consequentially the electrical channel between the start signal node ST(N) and the clock signal CK1 is maintained to be turned on by the P-type transistors 930, 940. Therefore, same as the clock signal CK1, the voltage level at the start signal node ST(N) is maintained at a low-voltage level during the operation period $T_{P2}$.

Because the voltage level at the start signal node ST(N) is converted to a low-voltage level during the operation period $T_{P2}$, the P-type transistor 620 in FIG. 6 is turned on thereby stabilizing the voltage level at the first control node Q(N) in a high-voltage state. In the meantime, the P-type transistor 630 in FIG. 6 is also turned on based on the same reason, and the voltage level at the first control node Q(N+1) in the next-stage (the (N+1)th-stage) shift register is pulled up and stabilized in a high-voltage state. Because the first control node Q(N) is stable in a high-voltage state and the voltage level at the start signal node ST(N) is converted to a low-voltage state, the P-type transistor 1012 in FIG. 11 is turned off but the P-type transistor 1022 is turned on.

According to the aforementioned operation of the present-stage (the Nth-stage) shift register, it is to be noted that the start signal S(N) of the present-stage (the Nth-stage) shift register is converted to a low-voltage level when the start signal S(N−1) of the previous-stage (the (N−1)th-stage) shift register is converted to a high-voltage level; so the start signal S(N+1) of the next-stage (the (N+1)th-stage) shift register is maintained in a high-voltage state during the operation period $T_{P2}$ on this basis. Therefore, the P-type transistor 1042 in FIG. 11 is also maintained in a turned-off state during the operation period $T_{P2}$.

According to the above description, the P-type transistors 1012, 1032 and 1042 in FIG. 11 are maintained in a turned-off state during the operation period $T_{P2}$; and the P-type transistor 1022 is in a turned-on state. Therefore, the electrical channel between the gate control signal output node SN(N) and the enable signal EN1 is turned on. Thus, same as the enable signal EN1, the voltage level at the gate control signal output node SN(N) is maintained in a low-voltage state after a high-voltage pulse of the enable signal EN1 during the operation period $T_{P2}$.

Also, because the first control signal Scan_N(N) is constituted by the voltage level at the gate control signal output node SN(N), the first control signal Scan_N(N) also drops to a low-voltage level along with the enable signal EN1 dropping to a low-voltage level during the operation period $T_{P2}$.

Then, as shown in FIG. 13, when the operation period $T_{P2}$ is end, the start signal S(N+1) is converted from a high-voltage level to a low-voltage level at the beginning of the operation period $T_{P3}$ and then is maintained at the low-voltage level during the operation period $T_{P3}$. With the start signal S(N+1) being converted from a high-voltage level to a low-voltage level, the P-type transistors 710, 720 in FIG. 7 are converted from a turned-off state to a turned-on state; and consequentially the electrical channel between the first control node Q(N) and the second operation voltage level VGL is turned on. Accordingly, the voltage level at the first control node Q(N) is pulled down to a lower voltage level (about the second operation voltage level VGL); and consequentially the P-type transistors 810, 820 in FIG. 8 and the P-type transistor 1012 in FIG. 11 are turned on. In addition, when the start signal S(N+1) is converted to a low-voltage level, the P-type transistor 1042 in FIG. 11 is turned. Accordingly, the electrical channel between the gate control signal output node SN(N) and the first operation voltage level VGH is turned on by the P-type transistors 1012, 1042, and the voltage level at the gate control signal output node SN(N) is pulled up to a high-voltage level.

Also, because the first control signal Scan_N(N) is constituted by the voltage level at the gate control signal output node SN(N), the first control signal Scan_N(N) is also pulled up to a high-voltage level during the operation period $T_{P3}$.

Furthermore, as described above, because the voltage level at the first control node Q(N) is pulled down to a low-voltage level, the P-type transistors 810, 820 are turned on; and consequentially the electrical channel between the second control node Boot(N) and the first operation voltage level VGH is turned on by the P-type transistor 810 and the electrical channel between the gate control signal output node ST(N) and the first operation voltage level VGH is turned on by the P-type transistor 820. Accordingly, both of the voltage levels at the second control node Boot(N) and the start signal node ST(N) are pulled to a high-voltage level, which is close to first operation potential VGH. Also, because the start signal S(N) is constituted by the voltage level at the gate control signal output node ST(N), the start signal S(N) is converted from a low-voltage level to a high-voltage level and is maintained in the high-voltage level during the operation period $T_{P3}$.

Figure 14:
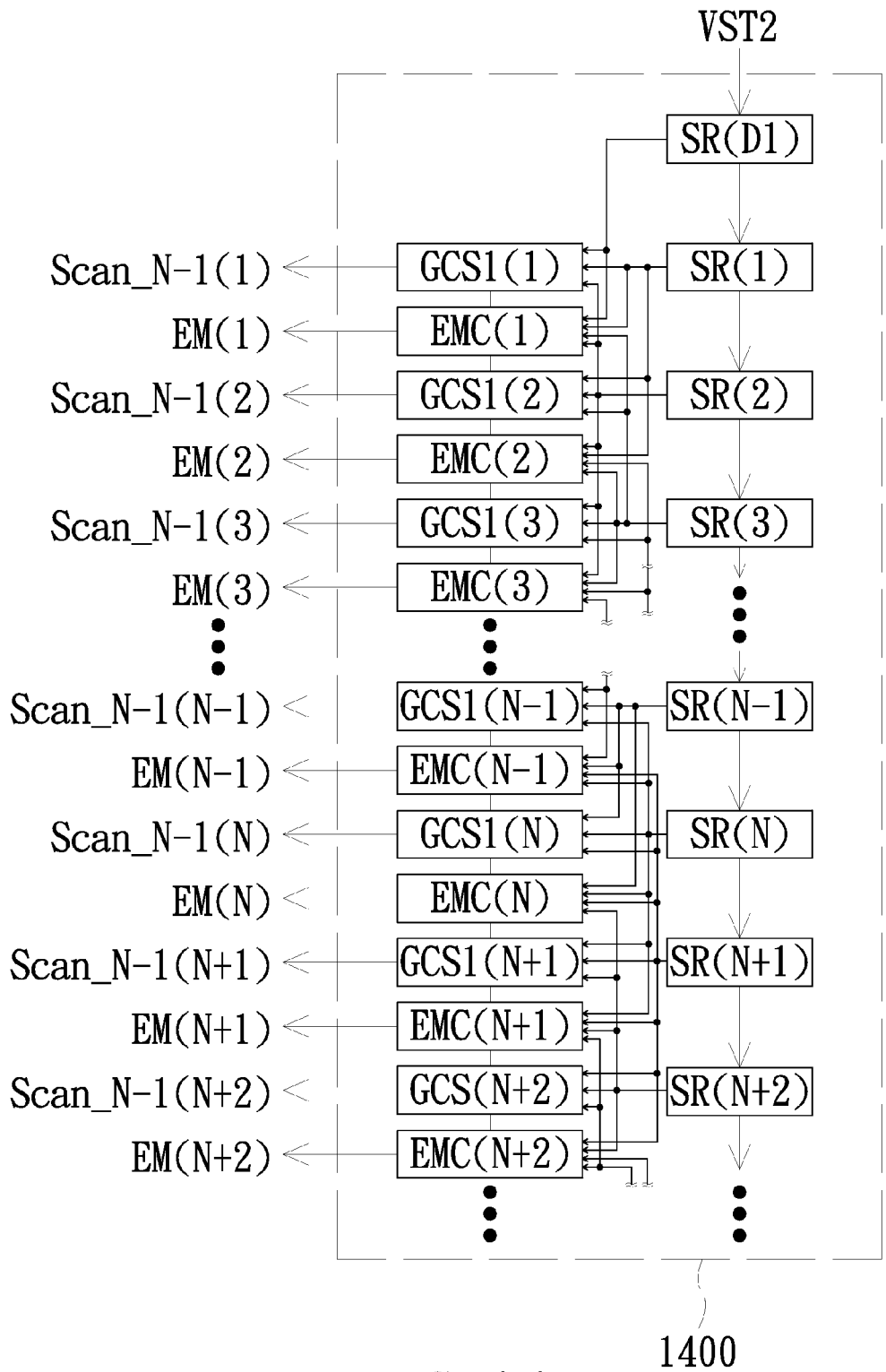
FIG. 14 is a circuit block view of a second gate line driving circuit in accordance with an embodiment of the present disclosure.

FIG. 14 is a circuit block view of a second gate line driving circuit in accordance with an embodiment of the present disclosure. As shown, the second gate line driving circuit 1400 in the present embodiment includes a plurality of shift registers, such as shift register SR(D1), SR(1), SR(2), SR(3), . . . , SR(N−1), SR(N), SR(N+1) and SR(N+2), a plurality of gate control signal generators, such as gate control signal generators GCS1(1), GCS1(2), GCS1(3), . . . , GCS1(N−1), GCS1(N), GCS1(N+1) and GCS1(N+2) and a plurality of light emitting control signal generators, such as light emitting control signal generators EMC(1), EMC(2), EMC(3), . . . , EMC(N−1), EMC (N), EMC(N+1) and EMC(N+2).

As shown in FIG. 14, the shift registers SR(D1), SR(1), SR(2), SR(3), . . . , SR(N−1), SR(N), SR(N+1) and SR(N+2) are sequentially coupled in a cascade manner and configured to sequentially transmit a start signal VST2 as illustrated in FIG. 4. Furthermore, each gate control signal generator and each light emitting control signal generator are electrically coupled to a plurality of respective shift registers thereby generating a respective second control signal and a respective light emitting control signal according to the outputs of the electrically-coupled shift registers, respectively.

It is to be noted that the shift registers used in the present embodiment of FIG. 14 are same as the shift registers used in the embodiment of FIG. 4, thus the shift registers in FIG. 14 and the shift registers in FIG. 4 have the same mark numbers. Similarly, the gate control signal generators used in the present embodiment of FIG. 14 are same as the gate control signal generators used in the embodiment of FIG. 4, thus the gate control signal generators in FIG. 14 and the gate control signal generators in FIG. 4 have the same mark numbers. However, it is understood that the second gate line driving circuit 1400 in the present embodiment is not limited to use the shift registers and the gate control signal generators same as those in the first gate line driving circuit. In fact, any shift register or gate control signal generator capable of achieving the same purpose are also adapted to be used in the second gate line driving circuit 1400. For example, the circuit designs illustrated in FIGS. 5~12 are adapted to be used in the second gate line driving circuit 1400 and also can make the shift registers SR(D1), SR(1), SR(2), SR(3), . . . , SR(N−1), SR(N), SR(N+1) and SR(N+2) and the gate control signal generator GCS1(1), GCS1(2), GCS1(3), . . . , GCS1(N−1), GCS1(N), GCS1(N+1) and GCS1(N+2) have normal functions. In addition, it is understood that the number of the dummy shift register or the time point to output the start signal VST2 may need to be modulated due to for appropriately providing the associated signals; and the detail will be described later. Because the specific circuit connections have been described in the above embodiments, no redundant detail is to be given herein.

Referring to FIG. 14 again. The main difference between the second gate line driving circuit 1400 of FIG. 14 and the first gate line driving circuit 400 of FIG. 4 is: the second gate line driving circuit 1400 in the present embodiment further includes a plurality of light emitting control signal generators, such as light emitting control signal generators EMC (1), EMC(2), EMC(3), . . . , EMC(N−1), EMC(N), EMC (N+1) and EMC(N+2). For example, the gate control signal generator GCS1(1) is connected to the shift register SR(D1), SR(1) and SR(2) and accordingly generates the second control signal Scan_N−1(1); the gate control signal generator GCS1(N) is connected to the shift register SR(N−1), SR(N) and SR(N+1) and accordingly generates the second control signal Scan_N−1(N); and so on. In addition, the light emitting control signal generators EMC(1) is connected to the shift register SR(D1), SR(1), SR(2), SR(3) and accordingly generates the light emitting control signal EM(1); the light emitting control signal generators EMC(N) is electrically coupled to the shift register SR(N−1), SR(N), SR(N+1), SR(N+2) and accordingly generates the light emitting control signal EM(N); and so on. In other words, the shift register SR(1) is connected to the gate control signal generators GCS1(1), GCS1(2) and the light emitting control signal generators EMC(1), EMC(2); the shift register SR(2) is connected to the gate control signal generators GCS1(1), GCS1(2), GCS1(3) and the light emitting control signal generators EMC(1), EMC(2), EMC(3); the shift register SR(N) is connected to the gate control signal generators GCS1(N−1), GCS1(N), GCS1(N+1) and the light emitting control signal generators EMC(N−1), EMC(N), EMC(N+1); and so on. The circuit structure and the operation of the light emitting control signal generator will be described in detailed as follow with a reference to related figures.

Figure 15A:
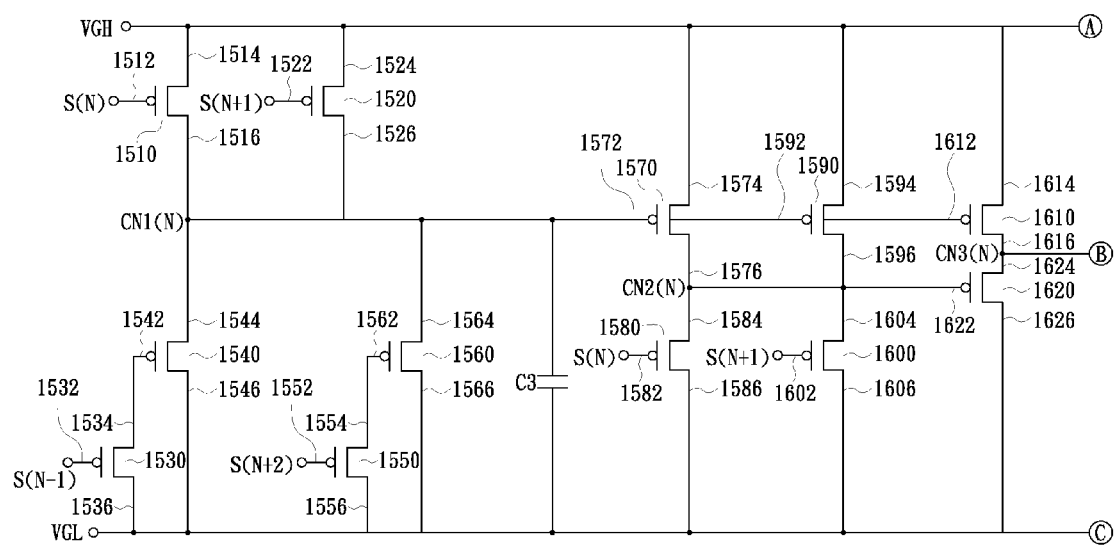
FIGS. 15A, 15B are detailed circuit views of a light emitting control signal generator in accordance with an embodiment of the present disclosure.
Figure 15B:
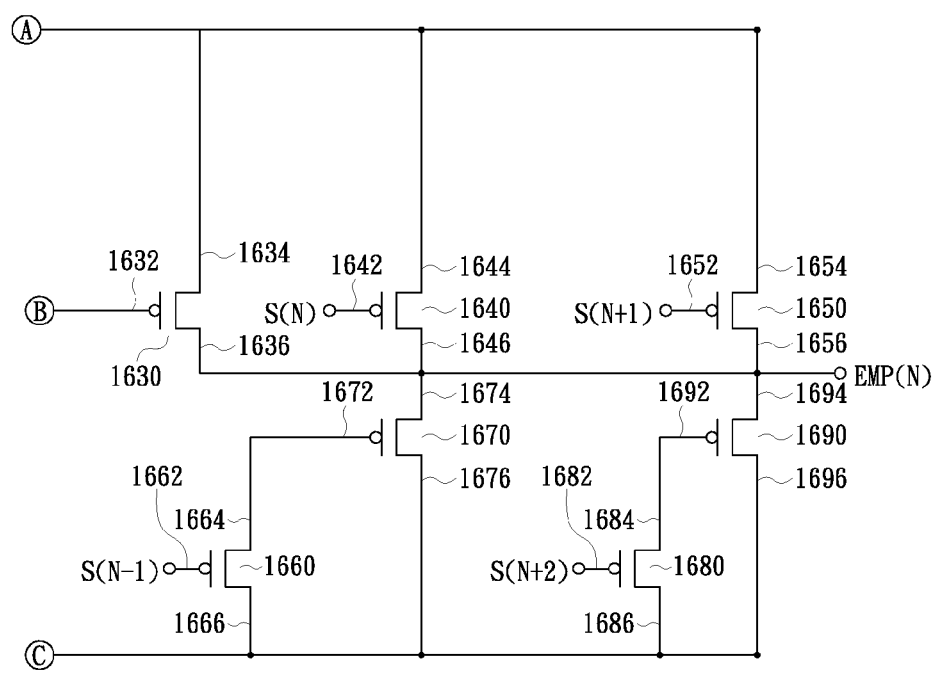

Referring to FIGS. 15A, 15B, which are detailed circuit views of a light emitting control signal generator in accordance with an embodiment of the present disclosure. As shown, the light emitting control signal generator in the present embodiment includes P-type transistors 1510, 1520, 1530, 1540, 1550, 1560, 1570, 1580, 1590, 1600, 1610, 1620, 1630, 1640, 1650, 1660, 1670, 1680 and 1690 and a capacitor C3. The following description is described based on using the Nth-stage light emitting control signal generator EMC(N) as an example.

In the present embodiment, the P-type transistor 1510 is configured to have its control terminal 1512 for receiving the start signal S(N) provided by the present-stage (the Nth-stage) shift register; its channel terminal 1514 for receiving the first operation voltage level VGH; and its channel terminal 1516 electrically coupled to the control node CN1 (N). The P-type transistor 1520 is configured to have its control terminal 1522 for receiving the start signal S(N+1) provided by the next-stage (the (N+1)th-stage) shift register; its channel terminal 1524 for receiving the first operation voltage level VGH; and its channel terminal 1526 electrically coupled to the control node CN1(N). The P-type transistor 1530 is configured to have its control terminal 1532 for receiving the start signal S(N−1) provided by the previous-stage (the (N−1)th-stage) shift register; and its channel terminal 1536 for receiving the second operation voltage level VGL. The P-type transistor 1540 is configured to have its control terminal 1542 electrically coupled to the channel terminal 1534 of the P-type transistor 1530; its channel terminal 1544 electrically coupled to the control node CN1(N); and its channel terminal 1546 for receiving the second operation voltage level VGL. The P-type transistor 1550 is configured to have its control terminal 1552 for receiving the start signal S(N+2) provided by the next-two-stage (the (N+2)th-stage) shift register; and its channel terminal 1556 for receiving the second operation voltage level VGL. The P-type transistor 1560 is configured to have its control terminal 1562 electrically coupled to the channel terminal 1554 of the P-type transistor 1550; its channel terminal 1564 electrically coupled to the control node CN1 (N); and its channel terminal 1566 for receiving the second operation voltage level VGL. The capacitor C3 is configured to have its first terminal electrically coupled to the control node CN1(N); and its second terminal for receiving the second operation voltage level VGL.

The P-type transistor 1570 is configured to have its control terminal 1572 electrically coupled to the control node CN1(N); its channel terminal 1574 for receiving the first operation voltage level VGH; and its channel terminal 1576 electrically coupled to a control node CN2(N). The P-type transistor 1580 is configured to have its control terminal 1582 for receiving the start signal S(N); its channel terminal 1584 electrically coupled to the control node CN2 (N); and its channel terminal 1586 for receiving the second operation voltage level VGL. The P-type transistor 1590 is configured to have its control terminal 1592 electrically coupled to the control node CN1(N); its channel terminal 1594 for receiving the first operation voltage level VGH; and its channel terminal 1596 electrically coupled to the control node CN2(N). The P-type transistor 1600 is configured to have its control terminal 1602 for receiving the start signal S(N+1); its channel terminal 1604 electrically coupled to the control node CN2(N); and its channel terminal 1606 for receiving the second operation voltage level VGL. The P-type transistor 1610 is configured to have its control terminal 1612 electrically coupled to the control node CN1 (N); its channel terminal 1614 for receiving the first operation voltage level VGH; and its channel terminal 1616 electrically coupled to a control node CN3(N). The P-type transistor 1620 is configured to have its control terminal 1622 electrically coupled to the control node CN2(N); its channel terminal 1624 electrically coupled to the control node CN3(N); and its channel terminal 1626 for receiving the second operation voltage level VGL.

The P-type transistor 1630 is configured to have its control terminal 1632 electrically coupled to the control node CN3(N) (through a node B); its channel terminal 1634 for receiving the first operation voltage level VGH (through a node A); and its channel terminal 1636 electrically coupled to a light emitting control signal generation node EMP(N). The P-type transistor 1640 is configured to have its control terminal 1642 for receiving the start signal S(N); its channel terminal 1644 for receiving the first operation voltage level VGH (through the node A); and its channel terminal 1646 electrically coupled to the light emitting control signal generation node EMP(N). The P-type transistor 1650 is configured to have its control terminal 1652 for receiving the start signal S(N+1); its channel terminal 1654 for receiving the first operation voltage level VGH (through the node A); and its channel terminal 1656 electrically coupled to the light emitting control signal generation node EMP(N).

The P-type transistor 1660 is configured to have its control terminal 1662 for receiving the start signal S(N−1); and its channel terminal 1666 for receiving the second operation voltage level VGL (through a node C). The P-type transistor 1670 is configured to have its control terminal 1672 electrically coupled to the channel terminal 1664 of the P-type transistor 1660; its channel terminal 1674 electrically coupled to the light emitting control signal generation node EMP(N); and its channel terminal 1676 for receiving the second operation voltage level VGL (through the node C). The P-type transistor 1680 is configured to have its control terminal 1682 for receiving the start signal S(N+2); and its channel terminal 1686 for receiving the second operation voltage level VGL (through the node C). The P-type transistor 1690 is configured to have its control terminal 1692 electrically coupled to the channel terminal 1684 of the P-type transistor 1680; its channel terminal 1694 electrically coupled to the light emitting control signal generation node EMP(N); and its channel terminal 1696 for receiving the second operation voltage level VGL (through the node C).

In the above circuit, it is to be noted that the light emitting control signal EM(N), generated by the light emitting control signal generator EMC(N), is constituted by the voltage level at the light emitting control signal generation node EMP(N). From another viewpoint, the light emitting control signal generator EMC(N) is configured to generate the corresponding light emitting control signal EM(N) by using the start signals S(N−1), S(N), S(N+1) and S(N+2); and that is the reason why the light emitting control signal generator EMC(N) in FIG. 14 are electrically coupled to the shift registers SR(N−1), SR(N), SR(N+1) and SR(N+2).

Figure 16:
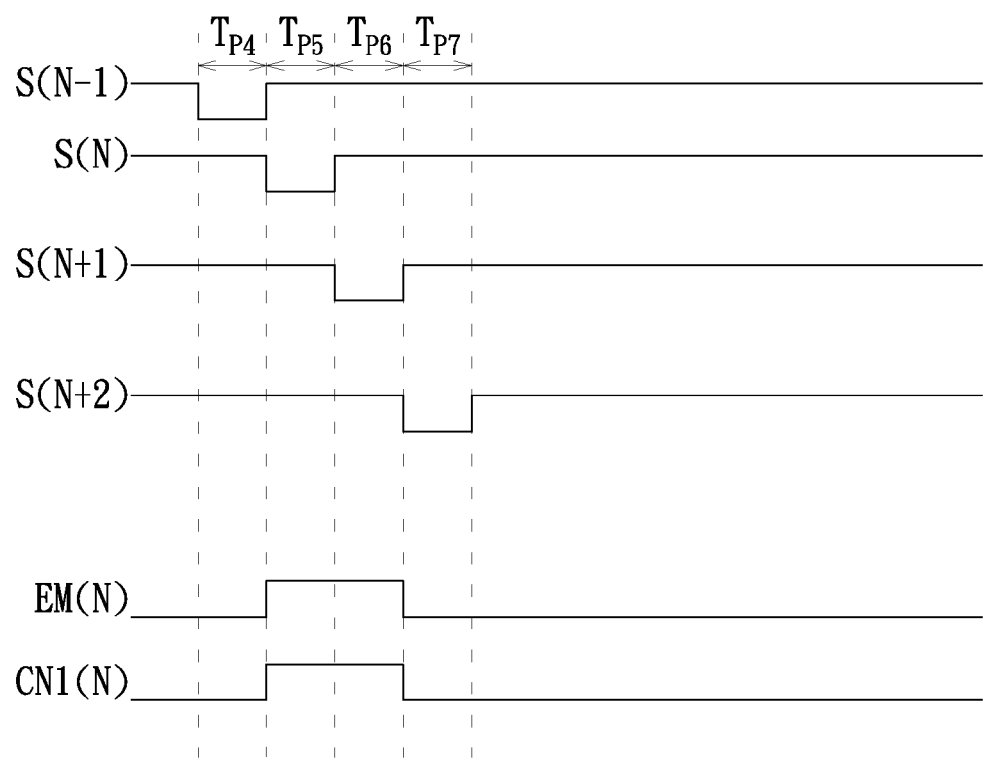
FIG. 16 is an operation timing chart of a light emitting control signal generator in accordance with an embodiment of the present disclosure.

Next, referring to FIG. 16, which is an operation timing chart of a light emitting control signal generator in accordance with an embodiment of the present disclosure. To facilitate a better understanding of the present disclosure, the following description is described based on using the Nth-stage light emitting control signal generator of FIG. 15 as an example. During the operation period $T_{P4}$, the start signal S(N−1) has a low-voltage level. Thus, the P-type transistor 1530 is turned on; the voltage level at the control terminal of the P-type transistor 1540 is pulled down to close to the second operation voltage level VGL; and the electrical channel between the two channel terminals 1544, 1546 of the P-type transistor 1540 is turned on. According to the descriptions about the operations of shift registers in the aforementioned embodiments, the start signals S(N), S(N+1) and S(N+2) are in a high-level state; thus, the P-type transistors 1510, 1520 are turned off and the voltage level at the control node CN1(N) is maintained in a low-voltage state which has a voltage level close to the second operation voltage level VGL. Accordingly, the P-type transistors 1570, 1590 are turned on; the P-type transistors 1580, 1600 are turned off; and the voltage level at the control node CN2(N) is maintained in a high-voltage state which has a voltage level close to the first operation voltage level VGH. Because the control node CN1(N) is in a low-voltage state and the control node CN2(N) is in a high-voltage state, the P-type transistor 1610 is turned on and the P-type transistor 1620 is turned off. Thus, the voltage level at the control node CN3(N) is maintained in a high-voltage state which has a voltage level close to the first operation voltage level VGH.

In summary, during the operation period $T_{P4}$, the P-type transistors 1630, 1640, 1650, 1680 and 1690 in FIG. 15B are turned off and only the P-type transistor 1660 is turned on; thus, the P-type transistor 1670 is also turned on. Therefore, during the operation period $T_{P4}$, the electrical channel from the light emitting control signal generation node EMP(N) to the second operation voltage level VGL is turned on, and accordingly the voltage level at the light emitting control signal generation node EMP(N) is approximately equal to the second operation voltage level VGL. Because the light emitting control signal EM(N) is constituted by the voltage level at the light emitting control signal generation node EMP(N), the light emitting control signal EM(N) is maintained in a low-voltage state during the operation period $T_{P4}$.

Next, during the operation period $T_{P5}$, the start signals S(N−1), S(N+1) and S(N+2) are maintained in a high-voltage state and only the start signal S(N) is maintained in a low-voltage state. Thus, the voltage level at the control node CN1(N) is pulled up to have a high-voltage state which has a voltage level close to the first operation voltage level VGH by the turned-on P-type transistor 1510. Accordingly, the voltage level at the control node CN2(N) is pulled down to have a low-voltage state which has a voltage level close to the second operation voltage level VGL by the turned-on P-type transistor 1580; and consequentially the voltage level at the control node CN3(N) is pulled down to have a low-voltage state which has a voltage level close to the second operation voltage level VGL by the turned-on P-type transistor 1620.

In summary, during the operation period $T_{P5}$, the P-type transistors 1650, 1660, 1670, 1680 and 1690 in FIG. 15B are turned off and only the P-type transistors 1630 and 1640 are turned on. Therefore, during the operation period $T_{P5}$, the electrical channel from the light emitting control signal generation node EMP(N) to the first operation voltage level VGH is turned on, and accordingly the voltage level at the light emitting control signal generation node EMP(N) is approximately equal to the first operation voltage level VGH. In other words, during the operation period $T_{P5}$, the light emitting control signal EM(N) is maintained in a high-voltage state.

Next, during the operation period $T_{P6}$, the start signals S(N−1), S(N) and S(N+2) are maintained in a high-voltage state and only the start signal S(N+1) is maintained in a low-voltage state. Thus, the voltage level at the control node CN1(N) is pulled up to have a high-voltage state which has a voltage level close to the first operation voltage level VGH by the turned-on P-type transistor 1520. Accordingly, the voltage level at the control node CN2(N) is pulled down to have a low-voltage state which has a voltage level close to the second operation voltage level VGL by the turned-on P-type transistor 1600; and consequentially the voltage level at the control node CN3(N) is pulled down to have a low-voltage state which has a voltage level close to the second operation voltage level VGL by the turned-on P-type transistor 1620.

In summary, during the operation period $T_{P6}$, the P-type transistors 1640, 1660, 1670, 1680 and 1690 in FIG. 15B are turned off and only the P-type transistors 1630 and 1650 are turned on. Therefore, during the operation period $T_{P6}$, the electrical channel from the light emitting control signal generation node EMP(N) to the first operation voltage level VGH is turned on, and accordingly the voltage level at the light emitting control signal generation node EMP(N) is approximately equal to the first operation voltage level VGH. In other words, during the operation period $T_{P6}$, the light emitting control signal EM(N) is maintained in a high-voltage state.

In the last during the operation period $T_{P7}$, the start signals S(N−1), S(N) and S(N+1) are maintained in a high-voltage state and only the start signal S(N+2) is maintained in a low-voltage state. Thus, the voltage level at the control node CN1(N) is pulled down to have a low-voltage state which has a voltage level close to the second operation voltage level VGL by the turned-on P-type transistors 1550 and 1560. Accordingly, the voltage level at the control node CN2(N) is pulled up to have a high-voltage state which has a voltage level close to the first operation voltage level VGH by the turned-on P-type transistors 1570 and 1590; and consequentially the voltage level at the control node CN3(N) is pulled up to have a high-voltage state which has a voltage level close to the first operation voltage level VGH by the turned-on P-type transistor 1610.

In summary, during the operation period $T_{P7}$, the P-type transistors 1630, 1640, 1650, 1660 and 1670 in FIG. 15B are turned off and only the P-type transistors 1680 and 1690 are turned on. Therefore, during the operation period $T_{P7}$, the electrical channel from the light emitting control signal generation node EMP(N) to the second operation voltage level VGL is turned on, and accordingly the voltage level at the light emitting control signal generation node EMP(N) is approximately equal to the second operation voltage level VGL. In other words, during the operation period $T_{P7}$, the light emitting control signal EM(N) is maintained in a low-voltage state.

Figure 17:
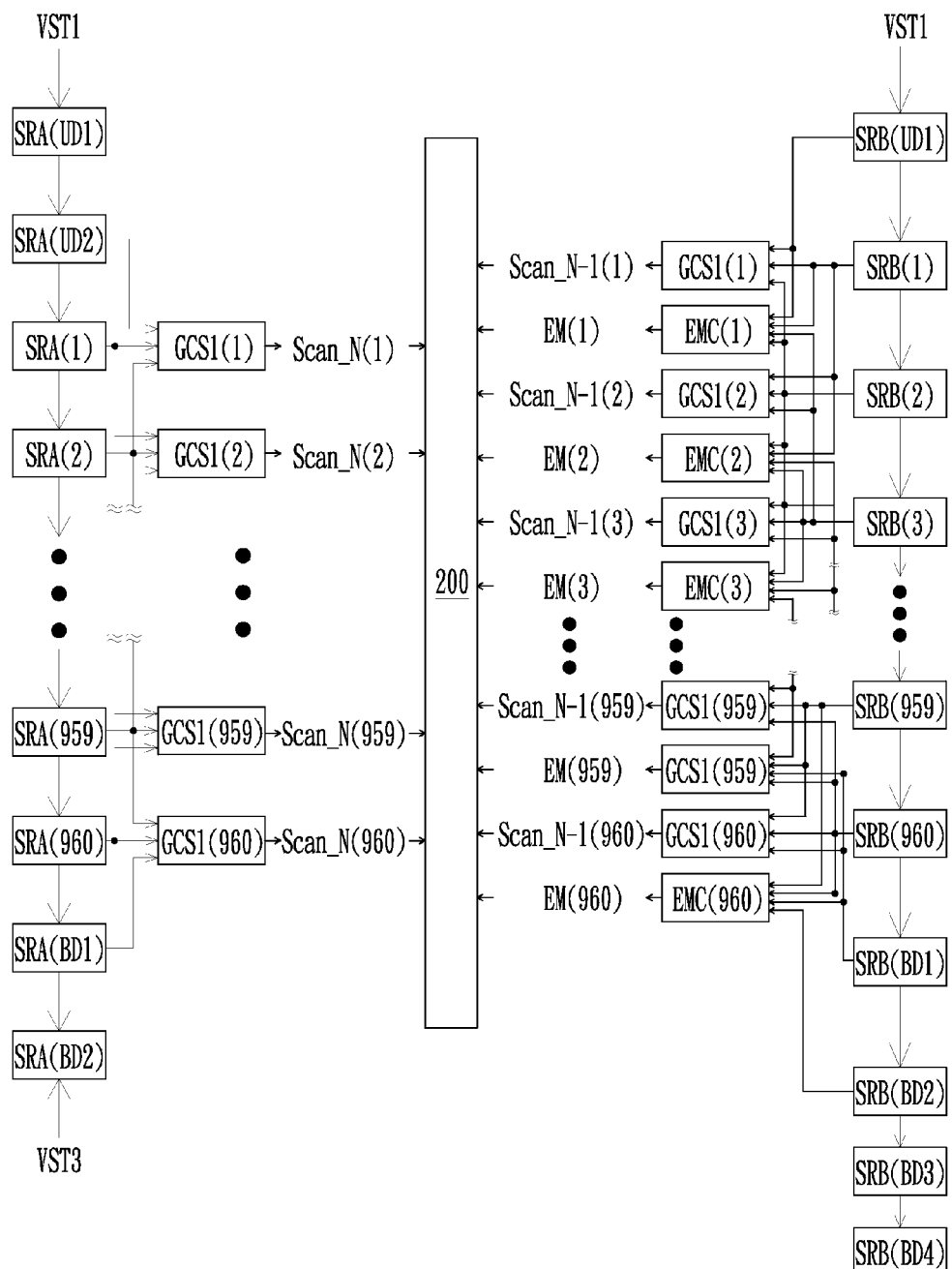
FIG. 17 is a circuit block view of a flat panel display in accordance with another embodiment of the present disclosure.

It is understood that circuit structures disclosed in the aforementioned embodiments are merely examples, which should not unduly limit the scope of the present disclosure. One of ordinary skill in the art would recognize many variations, alternatives, and modifications. For example, the object of reducing the number of various control signals can be achieved through an adjustment of the dummy shift registers. Referring FIG. 17, which is a circuit block view of a flat panel display in accordance with another embodiment of the present disclosure. As shown, the circuit disposed on the left side of the display area 200 includes two upper dummy shift registers SRA(UD1), SRA(UD2), a plurality of shift registers SRA(1)~SRA(960) and two bottom dummy shift register SRA(BD1), SRA(BD2), which are sequentially connected from top to bottom; and the circuit disposed on the right side of the display area 200 includes an upper dummy shift register SRB(UD1), a plurality of shift registers SRB(1)~SRB(960) and four bottom dummy shift registers SRB(BD1)~SRB(BD4), which are sequentially connected from top to bottom. Through the aforementioned circuit structure, one start signal VST1 can be used for both of the circuits disposed on two opposite sides of the display area 200 when the gate lines are being scanned from top to bottom, and consequentially the number of needed control signal is reduced. Similarly, one start signal VST3 can be used for both of the circuits disposed on two opposite sides of the display area 200 when the gate lines are being scanned from bottom to top.

In addition, preferably, each transistor in various unit or driving circuits in the aforementioned embodiments is integrated into the display panel. In other words, these transistors are formed on a substrate of the display panel together with pixels, data lines and driving lines; and the various units and driving circuits are not formed in the substrate of display panel through a chip bonding manner. Thus, the display panel of the present disclosure is realized by gate driver integrated on array/glass (GOA) circuits. In summary, by dividing the gate control signal generators into two areas in the present disclosure, the control signals Scan_N with higher driving impedances can be driven independently and the control signals Scan_N−1 with lower driving impedances and the light emitting control signals EM can be driven by another group of circuits. In addition, by employing the first gate line driving circuit and the second gate line driving circuit disclosed in the present disclosure, fewer switches are needed, the tolerance range of the manufacturing process offset is effectively enhanced, the abnormal function of circuits and the deterioration of image display caused by the electrical drifts resulted by the manufacturing process errors can be avoided. In addition, through the adjustment of the number of dummy shift register, the number of needed signal is reduced and accordingly the complexity of circuit layout is reduced.

While the disclosure has been described in terms of what is presently considered to be the most practical and preferred embodiments, it is to be understood that the disclosure needs not be limited to the disclosed embodiment. On the contrary, it is intended to cover various modifications and similar arrangements included within the spirit and scope of the appended claims which are to be accorded with the broadest interpretation so as to encompass all such modifications and similar structures.

What is claimed is:

1. A display panel, comprising:
a display area, comprising a plurality of pixels, each one of the plurality of pixels being configured to determine how to process a data transmitted on a data line according to a first control signal transmitted on a first gate line and a second control signal transmitted on a second gate line and determine when to emit a light according to a light emitting control signal transmitted on a light emitting control line;
a first gate line driving circuit, disposed in a first area outside the display area, the first gate line driving circuit being electrically coupled to the first gate line and configured to provide the first control signal to the first gate line, wherein the first gate line driving circuit comprises:
a plurality of shift registers, the plurality of shift register being sequentially connected in a cascade manner and configured to transmit a start signal from a Nth-stage of the plurality of shift registers to a (N+1)th-stage of the plurality of shift registers; and
a plurality of first gate control signal generators, each one of the plurality of first gate control signal generators being electrically coupled to a portion of the plurality of shift registers and configured to generate the respective first control signal according to outputs of the electrically-coupled shift registers;
wherein the Nth-stage shift register comprises:
a first pull-up circuit module, configured to receive a first operation voltage level and the start signal provided by a (N−1)th-stage of the plurality of shift registers to the Nth-stage shift register and determine whether to turn on an electrical channel from the first operation voltage level to a first control node or not according to the start signal provided by the (N−1)th-stage shift register and the start signal provided by the Nth-stage shift register;
a first pull-down circuit module, configured to receive a second operation voltage level and the start signal provided by the (N+1)th-stage shift register and determine whether to turn on an electrical channel from the second operation voltage level to the first control node or not according to the start signal provided by the (N+1)th-stage shift register;
a first pull-up control module, electrically coupled to the first control node and configured to receive the first operation voltage level and determine whether to turn on an electrical channel from the first operation voltage level to a second control node and an electrical channel from the first operation voltage level to a start signal node or not according to a voltage level at the first control node; and
a first pull-down control module, configured to receive a clock signal, the second operation voltage level and the start signal provided by the (N−1)th-stage shift register and determine whether to transmit the second operation voltage level to the second control node or not according to the start signal provided by the (N−1)th-stage shift register and determine whether to turn on an electrical channel from the clock signal to the start signal node or not according to a voltage level at the second control node, wherein the first pull-down control module comprises:
a first switch, comprising a control terminal, a first channel terminal and a second channel terminal, the first switch being configured to have its control terminal for receiving the start signal provided by the (N−1)th-stage shift register and its first channel terminal electrically coupled to the second control node;
a second switch, comprising a control terminal, a first channel terminal and a second channel terminal, the second switch being configured to have its control terminal for receiving the start signal provided by the (N−1)th-stage shift register, its first channel terminal electrically coupled to the second channel terminal of the first switch, and its second channel terminal for receiving the second operation voltage level;

a third switch, comprising a control terminal, a first channel terminal and a second channel terminal, the third switch being configured to have its control terminal electrically coupled to the second control node and its first channel terminal electrically coupled to the start signal node;

a fourth switch, comprising a control terminal, a first channel terminal and a second channel terminal, the fourth switch being configured to have its control terminal electrically coupled to the second control node, its first channel terminal electrically coupled to the second channel terminal of the third switch, and its second channel terminal for receiving the clock signal; and a capacitor, comprising a first terminal and a second terminal, the capacitor being configured to have its first terminal electrically coupled to the control terminal of the third switch and its second terminal electrically coupled to the start signal node;

wherein the start signal provided by the Nth-stage shift register is constituted by a voltage level at the start single node; and a second gate line driving circuit, disposed in a second area outside the display area, the second gate line driving circuit being electrically coupled to the second gate line and configured to provide the second control signal to the second gate line, the second gate line driving circuit being further electrically coupled to the light emitting control line and further configured to provide the light emitting control signal to the light emitting control line, wherein the first area and the second area are located on different sides of the display area.

2. The display panel according to claim 1, wherein the first pull-up circuit module comprises:

a first switch, comprising a control terminal, a first channel terminal and a second channel terminal, the first switch being configured to have its control terminal for receiving the start signal provided by the (N−1)th-stage shift register, its first channel terminal for receiving the first operation voltage level, and its second channel terminal electrically coupled to the first control node;

a second switch, comprising a control terminal, a first channel terminal and a second channel terminal, the second switch being configured to have its control terminal for receiving the start signal provided by the Nth-stage shift register, its first channel terminal for receiving the first operation voltage level, and its second channel terminal electrically coupled to the first control node; and a third switch, comprising a control terminal, a first channel terminal and a second channel terminal, the third switch being configured to have its control terminal for receiving the start signal provided by the Nth-stage shift register, its first channel terminal for receiving the first operation voltage level, and its second channel terminal electrically coupled to the first control node of the (N+1)th-stage shift register.

3. The display panel according to claim 1, wherein the first pull-down circuit module comprises:

a first switch, comprising a control terminal, a first channel terminal and a second channel terminal, the first switch being configured to have its control terminal for receiving the start signal provided by the (N+1)th-stage shift register and its first channel terminal electrically coupled to the first control node; and a second switch, comprising a control terminal, a first channel terminal and a second channel terminal, the second switch being configured to have its control terminal for receiving the start signal provided by the (N+1)th-stage shift register, its first channel terminal electrically coupled to the second channel terminal of the first switch, and its second channel terminal for receiving the second operation voltage level.

4. The display panel according to claim 1, wherein the first pull-up control module comprises:

a first switch, comprising a control terminal, a first channel terminal and a second channel terminal, the first switch being configured to have its control terminal electrically coupled to the first control node, its first channel terminal for receiving the first operation voltage level, and its second channel terminal electrically coupled to the second control node; and a second switch, comprising a control terminal, a first channel terminal and a second channel terminal, the second switch being configured to have its control terminal electrically coupled to the first control node, its first channel terminal for receiving the first operation voltage level, and its second channel terminal electrically coupled to the start signal node.

5. The display panel according to claim 1, wherein at least one of the plurality of first gate control signal generators comprises:

a second pull-up control module, electrically coupled to the first control node and a gate control signal output node and configured to receive the first operation voltage level and determine whether to turn on an electrical channel from the first operation voltage level to the gate control signal output node or not according to the voltage level at the first control node;

a second pull-down control module, electrically coupled to the start signal node and the gate control signal output node and configured to receive an enable signal and determine whether to turn on an electrical channel from the enable signal to the gate control signal output node or not according to a voltage level at the start signal node; and a second pull-up circuit module, electrically coupled to the gate control signal output node and configured to receive the start signal provided by the (N−1)th-stage shift register, the start signal provided by the (N+1)th-stage shift register and the first operation voltage level and determine whether to turn on an electrical channel from the first operation voltage level to the gate control signal output node or not according to the start signal provided by the (N−1)th-stage shift register and the start signal provided by the (N+1)th-stage shift register, wherein the first control signal provided by the Nth-stage shift register is constituted by a voltage level at the gate control signal output node.

6. The display panel according to claim 5, wherein the second pull-up control module comprises:

a switch, comprising a control terminal, a first channel terminal and a second channel terminal, the switch being configured to have its control terminal electrically coupled to the first control node, its first channel terminal for receiving the first operation voltage level, and its second channel terminal electrically coupled to the gate control signal output node.

7. The display panel according to claim 5, wherein the second pull-down control module comprises:

a switch, comprising a control terminal, a first channel terminal and a second channel terminal, the switch being configured to have its control terminal electrically coupled to the start signal node, its first channel terminal electrically coupled to the gate control signal output node, and its second channel terminal for receiving the enable signal.

8. The display panel according to claim 5, wherein the second pull-up circuit module comprises:
   a first switch, comprising a control terminal, a first channel terminal and a second channel terminal, the first switch being configured to have its control terminal for receiving the start signal provided by the (N−1)th-stage shift register, its first channel terminal for receiving the first operation voltage level, and its second channel terminal electrically coupled to the gate control signal output node; and
   a second switch, comprising a control terminal, a first channel terminal and a second channel terminal, the second switch being configured to have its control terminal for receiving the start signal provided by the (N+1)th-stage shift register, its first channel terminal for receiving the first operation voltage level, and its second channel terminal electrically coupled to the gate control signal output node.

9. The display panel according to claim 1, wherein the second gate line driving circuit comprises:
   a plurality of shift registers, the plurality of shift register being sequentially connected in a cascade manner and configured to transmit a start signal from a Nth-stage of the plurality of shift registers to a (N+1)th-stage of the plurality of shift registers;
   a plurality of second gate control signal generators, each one of the plurality of second gate control signal generators being electrically coupled to a portion of the plurality of shift registers and configured to generate the respective second control signal according to outputs of the electrically-coupled shift registers; and
   a plurality of light emitting control signal generators, each one of the plurality of the light emitting control signal generators being electrically coupled to a portion of the plurality of shift registers and configured to generate the respective light emitting control signal according to outputs of the electrically-coupled shift registers.

10. The display panel according to claim 9, wherein the Nth-stage shift register of the second gate line driving circuit comprises:
    a first pull-up circuit module, configured to receive a first operation voltage level and the start signal provided by a (N−1)th-stage of the plurality of shift registers to the Nth-stage shift register and determine whether to turn on an electrical channel from the first operation voltage level to a first control node or not according to the start signal provided by the (N−1)th-stage shift register and the start signal provided by the Nth-stage shift register;
    a first pull-down circuit module, configured to receive a second operation voltage level and the start signal provided by the (N+1)th-stage shift register and determine whether to turn on an electrical channel from the second operation voltage level to the first control node or not according to the start signal provided by the (N+1)th-stage shift register;
    a first pull-up control module, electrically coupled to the first control node and configured to receive the first operation voltage level and determine whether to turn on an electrical channel from the first operation voltage level to a second control node and an electrical channel from the first operation voltage level to a start signal node or not according to a voltage level at the first control node; and
    a first pull-down control module, configured to receive a clock signal, the second operation voltage level and the start signal provided by the (N−1)th-stage shift register and determine whether to transmit the second operation voltage level to the second control node or not according to the start signal provided by the (N−1)th-stage shift register and determine whether to turn on an electrical channel from the clock signal to the start signal node or not according to a voltage level at the second control node,
    wherein the start signal provided by the Nth-stage shift register is constituted by the voltage level at the start single node.

11. The display panel according to claim 10, wherein the first pull-up circuit module of the second gate line driving circuit comprises:
    a first switch, comprising a control terminal, a first channel terminal and a second channel terminal, the first switch being configured to have its control terminal for receiving the start signal provided by the (N−1)th-stage shift register, its first channel terminal for receiving the first operation voltage level, and its second channel terminal electrically coupled to the first control node;
    a second switch, comprising a control terminal, a first channel terminal and a second channel terminal, the second switch being configured to have its control terminal for receiving the start signal provided by the Nth-stage shift register, its first channel terminal for receiving the first operation voltage level, and its second channel terminal electrically coupled to the first control node; and
    a third switch, comprising a control terminal, a first channel terminal and a second channel terminal, the third switch being configured to have its control terminal for receiving the start signal provided by the Nth-stage shift register and its first channel terminal for receiving the first operation voltage level.

12. The display panel according to claim 10, wherein the first pull-down circuit module of the second gate line driving circuit comprises:
    a first switch, comprising a control terminal, a first channel terminal and a second channel terminal, the first switch being configured to have its control terminal for receiving the start signal provided by the (N+1)th-stage shift register and its first channel terminal electrically coupled to the first control node; and
    a second switch, comprising a control terminal, a first channel terminal and a second channel terminal, the second switch being configured to have its control terminal for receiving the start signal provided by the (N+1)th-stage shift register, its first channel terminal electrically coupled to the second channel terminal of the first switch, and its second channel terminal for receiving the second operation voltage level.

13. The display panel according to claim 10, wherein the first pull-up control module of the second gate line driving circuit comprises:
    a first switch, comprising a control terminal, a first channel terminal and a second channel terminal, the first switch being configured to have its control terminal electrically coupled to the first control node, its first channel terminal for receiving the first operation voltage level, and its second channel terminal electrically coupled to the second control node; and a second switch, comprising a control terminal, a first channel terminal and a second channel terminal, the second switch being configured to have its control terminal electrically coupled to the first control node, its first channel terminal for receiving the first operation voltage level, and its second channel terminal electrically coupled to the start signal node.

14. The display panel according to claim 10, wherein the first pull-down control module of the second gate line driving circuit comprises:

a first switch, comprising a control terminal, a first channel terminal and a second channel terminal, the first switch being configured to have its control terminal for receiving the start signal provided by the (N−1)th-stage shift register and its first channel terminal electrically coupled to the second control node;

a second switch, comprising a control terminal, a first channel terminal and a second channel terminal, the second switch being configured to have its control terminal for receiving the start signal provided by the (N−1)th-stage shift register, its first channel terminal electrically coupled to the second channel terminal of the first switch, and its second channel terminal for receiving the second operation voltage level;

a third switch, comprising a control terminal, a first channel terminal and a second channel terminal, the third switch being configured to have its control terminal electrically coupled to the second control node and its first channel terminal electrically coupled to the start signal node;

a fourth switch, comprising a control terminal, a first channel terminal and a second channel terminal, the fourth switch being configured to have its control terminal electrically coupled to the second control node, its first channel terminal electrically coupled to the second channel terminal of the third switch, and its second channel terminal for receiving the clock signal; and a capacitor, comprising a first terminal and a second terminal, the capacitor being configured to have its first terminal electrically coupled to the control terminal of the third switch and its second terminal electrically coupled to the start signal node.

15. The display panel according to claim 10, wherein at least one of the plurality of second gate control signal generators comprises:

a second pull-up control module, electrically coupled to the first control node and a gate control signal output node and configured to receive the first operation voltage level and determine whether to turn on an electrical channel from the first operation voltage level to the gate control signal output node or not according to the voltage level at the first control node;

a second pull-down control module, electrically coupled to the start signal node and the gate control signal output node and configured to receive an enable signal and determine whether to turn on an electrical channel from the enable signal to the gate control signal output node or not according to a voltage level at the start signal node; and a second pull-up circuit module, electrically coupled to the gate control signal output node and configured to receive the start signal provided by the (N−1)th-stage shift register, the start signal provided by the (N+1)th-stage shift register and the first operation voltage level and determine whether to turn on an electrical channel from the first operation voltage level to the gate control signal output node or not according to the start signal provided by the (N−1)th-stage shift register and the start signal provided by the (N+1)th-stage shift register, wherein the second control signal provided by the Nth-stage shift register is constituted by the voltage level at the gate control signal output node.

16. The display panel according to claim 15, wherein the second pull-up control module comprises:

a switch, comprising a control terminal, a first channel terminal and a second channel terminal, the switch being configured to have its control terminal electrically coupled to the first control node, its first channel terminal for receiving the first operation voltage level, and its second channel terminal electrically coupled to the gate control signal output node.

17. The display panel according to claim 15, wherein the second pull-down control module comprises:

a switch, comprising a control terminal, a first channel terminal and a second channel terminal, the switch being configured to have its control terminal electrically coupled to the start signal node, its first channel terminal electrically coupled to the gate control signal output node, and its second channel terminal for receiving the enable signal.

18. The display panel according to claim 15, wherein the second pull-up circuit module comprises:

a first switch, comprising a control terminal, a first channel terminal and a second channel terminal, the first switch being configured to have its control terminal for receiving the start signal provided by the (N−1)th-stage shift register, its first channel terminal for receiving the first operation voltage level, and its second channel terminal electrically coupled to the gate control signal output node; and a second switch, comprising a control terminal, a first channel terminal and a second channel terminal, the second switch being configured to have its control terminal for receiving the start signal provided by the (N+1)th-stage shift register, its first channel terminal for receiving the first operation voltage level, and its second channel terminal electrically coupled to the gate control signal output node.

19. The display panel according to claim 10, wherein at least one of the plurality of light emitting control signal generators comprises:

a first switch, comprising a control terminal, a first channel terminal and a second channel terminal, the first switch being configured to have its control terminal for receiving the start signal provided by the Nth-stage shift register, its first channel terminal for receiving the first operation voltage level, and its second channel terminal electrically coupled to a first control node;

a second switch, comprising a control terminal, a first channel terminal and a second channel terminal, the second switch being configured to have its control terminal for receiving the start signal provided by the (N+1)th-stage shift register, its first channel terminal for receiving the first operation voltage level, and its second channel terminal electrically coupled to the first control node;

a third switch, comprising a control terminal, a first channel terminal and a second channel terminal, the third switch being configured to have its control terminal for receiving the start signal provided by the (N−1)th-stage shift register and its second channel terminal for receiving the second operation voltage level;

a fourth switch, comprising a control terminal, a first channel terminal and a second channel terminal, the fourth switch being configured to have its control terminal electrically coupled to the first channel terminal of the third transistor, its first channel terminal electrically coupled to the first control node, and its second channel terminal for receiving the second operation voltage level;

a fifth switch, comprising a control terminal, a first channel terminal and a second channel terminal, the fifth switch being configured to have its control terminal for receiving the start signal provided by a (N+2)th-stage of the plurality of shift registers and its second channel terminal for receiving the second operation voltage level, wherein the (N+2)th-stage shift register is a shift register next stage of the (N+1)th-stage shift register;

a sixth switch, comprising a control terminal, a first channel terminal and a second channel terminal, the sixth switch being configured to have its control terminal electrically coupled to the first channel terminal of the fifth transistor, its first channel terminal electrically coupled to the first control node, and its second channel terminal for receiving the second operation voltage level;

a capacitor, comprising a first terminal and a second terminal, the capacitor being configured to have its first terminal electrically coupled to the first control node and its second terminal for receiving the second operation voltage level;

a seventh switch, comprising a control terminal, a first channel terminal and a second channel terminal, the seventh switch being configured to have its control terminal electrically coupled to the first control node, its first channel terminal for receiving the first operation voltage level, and its second channel terminal electrically coupled to a second control node;

an eighth switch, comprising a control terminal, a first channel terminal and a second channel terminal, the eighth switch being configured to have its control terminal for receiving the start signal provided by the Nth-stage shift register, its first channel terminal electrically coupled to the second control node, and its second channel terminal for receiving the second operation voltage level;

a ninth switch, comprising a control terminal, a first channel terminal and a second channel terminal, the ninth switch being configured to have its control terminal electrically coupled to the first control node, its first channel terminal for receiving the first operation voltage level, and its second channel terminal electrically coupled to the second control node;

a tenth switch, comprising a control terminal, a first channel terminal and a second channel terminal, the tenth switch being configured to have its control terminal for receiving the start signal provided by the (N+1)th-stage shift register, its first channel terminal electrically coupled to the second control node, and its second channel terminal for receiving the second operation voltage level;

an eleventh switch, comprising a control terminal, a first channel terminal and a second channel terminal, the eleventh switch being configured to have its control terminal electrically coupled to the first control node, its first channel terminal for receiving the first operation voltage level, and its second channel terminal electrically coupled to a third control node;

a twelfth switch, comprising a control terminal, a first channel terminal and a second channel terminal, the twelfth switch being configured to have its control terminal electrically coupled to the second control node, its first channel terminal electrically coupled to the third control node, and its second channel terminal for receiving the second operation voltage level;

a thirteenth switch, comprising a control terminal, a first channel terminal and a second channel terminal, the thirteenth switch being configured to have its control terminal electrically coupled to the third control node, its first channel terminal for receiving the first operation voltage level, and its second channel terminal electrically coupled to a light emitting control signal generation node, wherein the light emitting control signal is constituted by a voltage level at the light emitting control signal generation node;

a fourteenth switch, comprising a control terminal, a first channel terminal and a second channel terminal, the fourteenth switch being configured to have its control terminal for receiving the start signal provided by the Nth-stage shift register, its first channel terminal for receiving the first operation voltage level, and its second channel terminal electrically coupled to the light emitting control signal generation node;

a fifteenth switch, comprising a control terminal, a first channel terminal and a second channel terminal, the fifteenth switch being configured to have its control terminal for receiving the start signal provided by the (N+1)th-stage shift register, its first channel terminal for receiving the first operation voltage level, and its second channel terminal electrically coupled to the light emitting control signal generation node;

a sixteenth switch, comprising a control terminal, a first channel terminal and a second channel terminal, the sixteenth switch being configured to have its control terminal for receiving the start signal provided by the (N−1)th-stage shift register and its second channel terminal for receiving the second operation voltage level;

a seventeenth switch, comprising a control terminal, a first channel terminal and a second channel terminal, the seventeenth switch being configured to have its control terminal electrically coupled to the first channel terminal of the sixteenth switch, its first channel terminal electrically coupled to the light emitting control signal generation node, and its second channel terminal for receiving the second operation voltage level;

an eighteenth switch, comprising a control terminal, a first channel terminal and a second channel terminal, the eighteenth switch being configured to have its control terminal for receiving the start signal provided by the (N+2)th-stage shift register and its second channel terminal for receiving the second operation voltage level; and a nineteenth switch, comprising a control terminal, a first channel terminal and a second channel terminal, the nineteenth switch being configured to have its control terminal electrically coupled to the first channel terminal of the eighteenth switch, its first channel terminal electrically coupled to the light emitting control signal generation node, and its second channel terminal for receiving the second operation voltage level.

* * * * *